United States Patent
Yang

(10) Patent No.: US 11,699,734 B2
(45) Date of Patent: Jul. 11, 2023

(54) SEMICONDUCTOR DEVICE WITH RESISTANCE REDUCTION ELEMENT AND METHOD FOR FABRICATING THE SAME

(71) Applicant: NANYA TECHNOLOGY CORPORATION, New Taipei (TW)

(72) Inventor: Cheng-Ling Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 117 days.

(21) Appl. No.: 17/172,415

(22) Filed: Feb. 10, 2021

(65) Prior Publication Data

US 2022/0254895 A1    Aug. 11, 2022

(51) Int. Cl.
| | |
|---|---|
| *H01L 29/45* | (2006.01) |
| *H01L 29/78* | (2006.01) |
| *H01L 29/66* | (2006.01) |
| *H01L 29/417* | (2006.01) |
| *H01L 21/285* | (2006.01) |
| *H01L 29/08* | (2006.01) |

(52) U.S. Cl.
CPC ........ *H01L 29/45* (2013.01); *H01L 21/28518* (2013.01); *H01L 29/0847* (2013.01); *H01L 29/41791* (2013.01); *H01L 29/66795* (2013.01); *H01L 29/7851* (2013.01)

(58) Field of Classification Search
CPC ..................... H01L 29/41791; H01L 21/28518
See application file for complete search history.

(56) References Cited

U.S. PATENT DOCUMENTS

| | | | | |
|---|---|---|---|---|
| 2013/0082393 | A1* | 4/2013 | Kawamura | H01L 21/02126 257/773 |
| 2014/0029181 | A1* | 1/2014 | Gstrein | H01L 23/53233 257/E21.585 |
| 2015/0214113 | A1 | 7/2015 | Bouche et al. | |
| 2018/0254246 | A1* | 9/2018 | Park | H01L 23/53204 |
| 2018/0261544 | A1* | 9/2018 | Kim | H01L 23/53223 |
| 2019/0131428 | A1 | 5/2019 | Huang et al. | |
| 2019/0363180 | A1 | 11/2019 | Zang et al. | |
| 2020/0373165 | A1* | 11/2020 | Park | H01L 29/45 |
| 2021/0082821 | A1* | 3/2021 | Tsai | H01L 23/485 |
| 2021/0376139 | A1* | 12/2021 | Huang | H01L 29/4975 |

FOREIGN PATENT DOCUMENTS

| | | |
|---|---|---|
| TW | 200910521 A | 3/2009 |
| TW | 201428967 A | 7/2014 |
| TW | 201935649 A | 9/2019 |
| TW | 202044357 A | 12/2020 |

* cited by examiner

*Primary Examiner* — Farun Lu
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a fin, a gate structure positioned on the fin, impurity regions positioned on two sides of the fin, contacts positioned on the impurity regions, and conductive covering layers positioned on the contacts. The conductive covering layers are formed of copper germanide.

5 Claims, 24 Drawing Sheets

SEMICONDUCTOR DEVICE WITH RESISTANCE REDUCTION ELEMENT AND METHOD FOR FABRICATING THE SAME

TECHNICAL FIELD

The present disclosure relates to a semiconductor device and a method for fabricating the semiconductor device, and more particularly, to a semiconductor device with a resistance reduction element, and a method for fabricating the semiconductor device with the resistance reduction element.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a fin, a gate structure positioned on the fin, impurity regions positioned on two sides of the fin, contacts positioned on the impurity regions, and conductive covering layers positioned on the contacts. The conductive covering layers comprise copper germanide.

In some embodiments, the semiconductor device includes a first dielectric layer positioned on the gate structure. Top surfaces of the contacts are at a vertical level above a vertical level of a top surface of the first dielectric layer.

In some embodiments, the semiconductor device includes contact spacers positioned on sides of the contacts and positioned between the first dielectric layer and the impurity regions.

In some embodiments, top surfaces of the impurity regions are at a vertical level above a vertical level of a top surface of the fin.

In some embodiments, the gate structure includes a gate dielectric layer positioned on the fin, a gate conductive layer positioned on the gate dielectric layer, and a gate filler layer positioned on the gate conductive layer.

In some embodiments, the semiconductor device includes bottom conductive layers positioned between the contacts and the impurity regions. The bottom conductive layers are formed of titanium silicide, nickel silicide, nickel platinum silicide, tantalum silicide, or cobalt silicide.

In some embodiments, the semiconductor device includes a buried insulation layer positioned below the fin.

In some embodiments, the semiconductor device includes a first dielectric layer positioned on the gate structure and a second dielectric layer positioned on the first dielectric layer. The contacts are positioned along the first dielectric layer and the second dielectric layer and protruding from a top surface of the second dielectric layer.

In some embodiments, the contacts include lower portions positioned on the impurity regions and below the first dielectric layer, middle portions positioned along the first dielectric layer and on the lower portions, and upper portions positioned along the second dielectric layer, on the middle portions, and protruding from the top surface of the second dielectric layer. The conductive covering layers are positioned on the upper portions.

In some embodiments, widths of the lower portions are greater than widths of the middle portions.

In some embodiments, widths of the upper portions are greater than widths of the middle portions.

In some embodiments, widths of the upper portions are greater than widths of the lower portions.

Another aspect of the present disclosure provides a semiconductor device including a fin, a gate structure positioned on the fin, impurity regions positioned on two sides of the fin, contacts positioned on the impurity regions, and top conductive layers positioned on the contacts. The top conductive layers are formed of titanium silicide, nickel silicide, nickel platinum silicide, tantalum silicide, or cobalt silicide.

In some embodiments, the semiconductor device includes barrier layers positioned between the contacts and the gate structure and between the contacts and the impurity regions.

In some embodiments, the semiconductor device includes a first dielectric layer and barrier spacers. The first dielectric layer is positioned on the gate structure, the contacts and the barrier layers are positioned along the first dielectric layer and protruding from a top surface of the first dielectric layer, and the barrier spacers are positioned on sides of the barrier layers and on the top surface of the first dielectric layer.

In some embodiments, the semiconductor device includes a first dielectric layer positioned on the gate structure and a second dielectric layer positioned on the first dielectric layer. The contacts include lower portions positioned on the impurity regions and below the first dielectric layer, middle portions positioned along the first dielectric layer and on the lower portions, and upper portions positioned along the second dielectric layer, on the middle portions, and protruding from a top surface of the second dielectric layer. The top conductive layers are positioned on the upper portions.

In some embodiments, the semiconductor device includes barrier layers and barrier spacers. The barrier layers are positioned between the lower portions and the middle portions, between the middle portions and the first dielectric layer, and positioned on sides of the upper portions, and the barrier spacers are positioned on sides of the barrier layers and on the top surface of the second dielectric layer.

In some embodiments, the semiconductor device includes bottom conductive layers positioned between the lower portions and the impurity regions. The bottom conductive layers are formed of titanium silicide, nickel silicide, nickel platinum silicide, tantalum silicide, or cobalt silicide.

Another aspect of the present disclosure provides a semiconductor device including a fin, a gate structure positioned on the fin, a first dielectric layer positioned on the gate structure, impurity regions positioned on two sides of the fin, contacts including lower portions positioned on the impurity regions and below the first dielectric layer, middle portions positioned on the lower portions and along the first dielectric layer, and upper portions positioned on the middle portions, and insulation layers positioned on the first dielectric layer and between the upper portions.

Another aspect of the present disclosure provides a method for fabricating a semiconductor device including forming a gate structure over a fin, forming impurity regions on two sides of the fin, forming contacts on the impurity regions, and forming conductive covering layers on the contacts. The conductive covering layers are formed of copper germanide.

In some embodiments, the conductive covering layers comprise copper germanide.

In some embodiments, the method further comprises: forming a first dielectric layer on the gate structure, wherein top surfaces of the contacts are at a vertical level above a vertical level of a top surface of the first dielectric layer.

In some embodiments, the method further comprises: forming contact spacers on sides of the contacts and between the first dielectric layer and the impurity regions.

In some embodiments, the top conductive layers are formed of titanium silicide, nickel silicide, nickel platinum silicide, tantalum silicide, or cobalt silicide.

Due to the design of the semiconductor device of the present disclosure, the conductive covering layers formed of copper germanide may reduce the contact resistance of the semiconductor device. According, the performance of the semiconductor device may be improved, and the energy consumption of the semiconductor device may be reduced.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
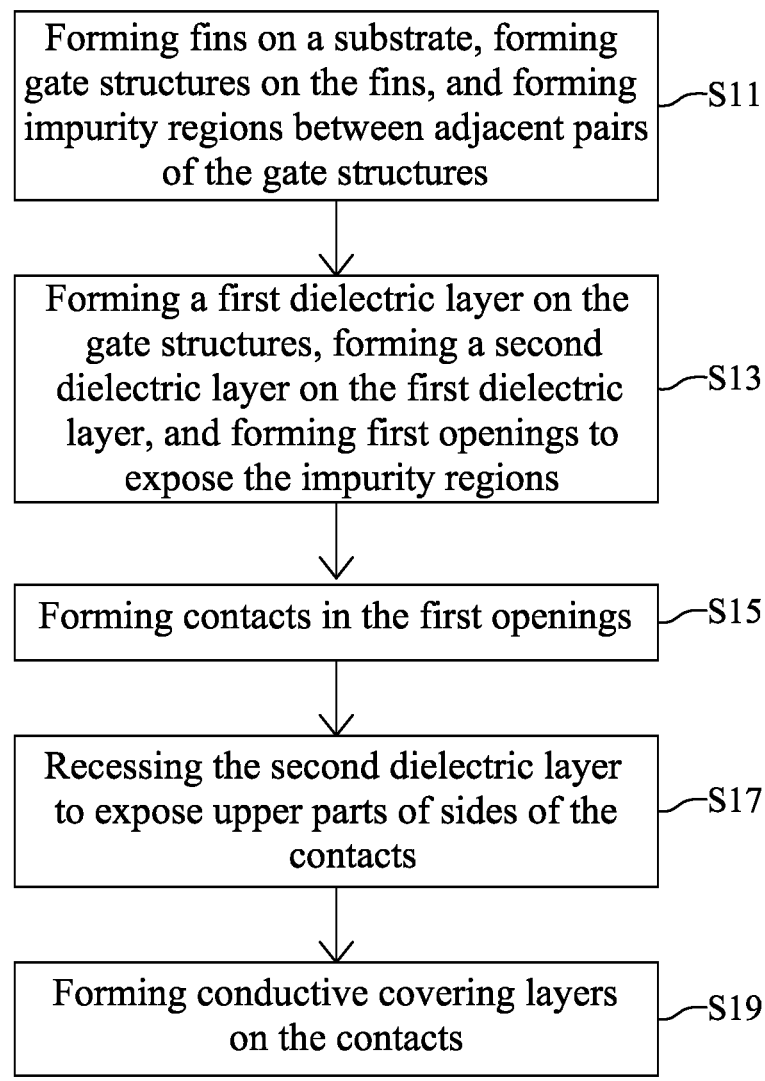
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 7 illustrate, in schematic cross-sectional view diagrams, a flow for fabricating the semiconductor device 1A in accordance with one embodiment of the present disclosure.

Figure 2:
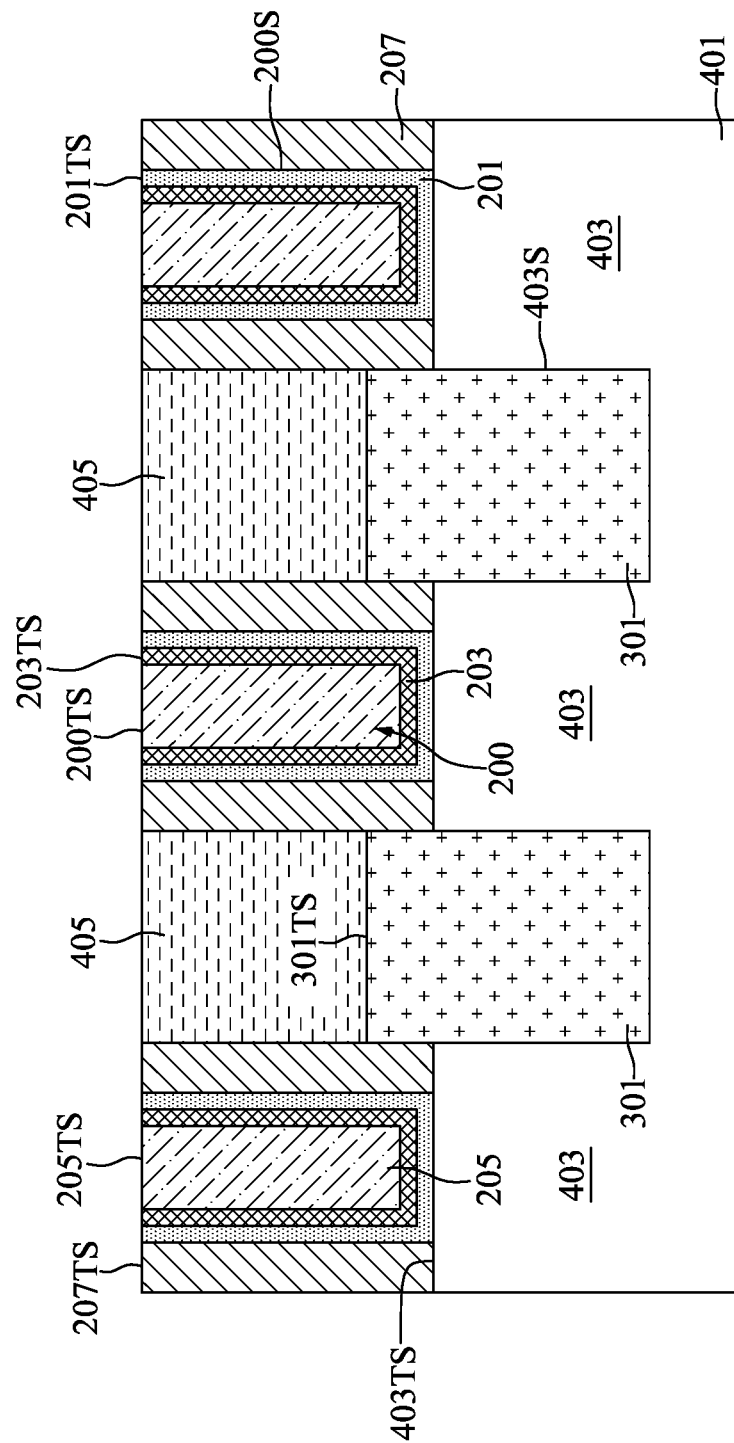
FIGS. 2 to 7 illustrate, in schematic cross-sectional view diagrams, a flow for fabricating the semiconductor device in accordance with one embodiment of the present disclosure.

With reference to FIGS. 1 and 2, at step S11, fins 403 may be formed on a substrate 401, gate structures 200 may be formed on the fins 403, and impurity regions 301 may be formed between adjacent pairs of the gate structures 200.

With reference to FIG. 2, the substrate 401 may include bulk silicon, or another suitable substrate material, e.g., a bulk semiconductor. In some embodiments, the substrate 401 may include a silicon-containing material. Illustrative examples of silicon-containing materials suitable for the substrate 401 may include, but are not limited to, silicon, silicon germanium, carbon doped silicon germanium, silicon germanium carbide, carbon-doped silicon, silicon carbide, and multi-layers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

With reference to FIG. 2, the fins 403 may be formed on the substrate 401 and separated from each other. In some embodiments, the fins 403 may be formed by recessing portions of the fins 403. In other words, the fins 403 may be formed of a same material as the substrate 401. In some embodiments, the fins 403 may be formed by depositing a semiconductor layer with subsequent patterning. The semiconductor layer may include, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof. It should be noted that the fins 403 include three fins 403, but the number of fins 403 is not limited thereto. For example, the number of the fins 403 may be less than three or more than three.

With reference to FIG. 2, the gate structures 200 may be formed on the fins 403 and separated from each other. Specifically, dummy gate structures (not shown) may be formed on the fins 403. Gate spacers 207 may be formed on sides of the dummy gate structures. A selective etch process may be performed to remove the dummy gate structures and form gate openings (not shown) in the places where the dummy gate structures previously occupied. The gate structures 200 may be formed in the gate openings. Each of the gate structures 200 may include a gate dielectric layer 201, a gate conductive layer 203, and a gate filler layer 205.

With reference to FIG. 2, the gate dielectric layer 201 may have an U-shaped cross-sectional profile. The gate dielectric layer 201 may be formed on the fins 403. The gate dielectric layer 201 may have a thickness between about 0.5 nm and about 5.0 nm. In some embodiments, the thickness of the gate dielectric layer 201 may be between about 0.5 nm and about 2.5 nm. The gate dielectric layer 201 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Specifically, the gate dielectric layer 201 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In other embodiments, the gate dielectric layer 201 may be a multilayer structure that includes, for example, one layer of silicon oxide and another layer of high-k dielectric material.

With reference to FIG. 2, the gate conductive layer 203 may be conformally formed on the gate dielectric layer 201. The gate conductive layer 203 may have an U-shaped cross-sectional profile. The gate conductive layer 203 may have a thickness between about 10 angstroms and about 200 angstroms. The top surfaces 203TS of the gate conductive layer 203 may be substantially coplanar with the top surfaces 201TS of the gate dielectric layer 201.

In some embodiments, the gate conductive layer 203 may include a capping layer (not shown) conformally formed on the gate dielectric layer 201, and one or more work function adjusting layers (not shown) conformally formed on the capping layer. In some embodiments, the capping layer may include a first sub-layer (not shown) on the gate dielectric layer 201 and a second sub-layer (not shown) on the first sub-layer. The first sub-layer may be formed of titanium nitride or the like using atomic layer deposition, chemical vapor deposition, or the like, and the second sub-layer may be formed of tantalum nitride or the like using atomic layer deposition, chemical vapor deposition, or the like.

In some embodiments, the work function adjusting layer(s) may be formed of, for example, p-type work function metal materials and n-type work function metal materials. The p-type work function materials may include compositions such as ruthenium, palladium, platinum, cobalt, nickel, and conductive metal oxides, titanium nitride, or a combination thereof. The n-type metal materials may include compositions such as hafnium, zirconium, titanium, tantalum, aluminum, metal carbides (e.g., hafnium carbide, zirconium carbide, titanium carbide, and aluminum carbide), aluminides, or a combination thereof. The work function adjusting layer(s) may be formed by using atomic layer deposition, chemical vapor deposition, or the like. The work function adjusting layer(s) may set the threshold voltage (Vt) of the semiconductor device 1A to a predetermined value. In some embodiments, the work function adjusting layer(s) serves dual purposes: Vt setting and gate conductor.

With reference to FIG. 2, the gate filler layer 205 may be formed on the gate conductive layer 203 to completely fill the gate opening. The top surface 205TS of the gate filler layer 205 may be substantially coplanar with the top surfaces 203TS of the gate conductive layer 203 and the top surfaces 201TS of the gate dielectric layer 201. The top surfaces 201TS of the gate dielectric layer 201, the top surfaces 203TS of the gate conductive layer 203, and the top surface 205TS of the gate filler layer 205 together configure the top surface 200TS of the gate structure 200.

The gate filler layer 205 may be formed of, for example, tungsten, aluminum, cobalt, ruthenium, gold, silver, titanium, platinum, the like, or a combination thereof and may be deposited using chemical vapor deposition, physical vapor deposition, plating, thermal or e-beam evaporation, the like, or a combination thereof.

In some embodiments, a gate interfacial layer (not shown) may be formed between the gate dielectric layer 201 and the fin 403. The gate interfacial layer may be formed of an oxide and may be formed by thermal oxidation, atomic layer deposition, chemical vapor deposition, or the like. For example, the gate interfacial layer may be silicon oxide. In some embodiments, the gate interfacial layer may have a thickness between about 8 angstroms and 10 angstroms. The gate interfacial layer may facilitate the formation of the gate dielectric layer 201 during fabrication of the semiconductor device 1A.

With reference to FIG. 2, the impurity regions 301 may be formed on sides 403S of the fins 403 and between adjacent pairs of the gate structures 200. The top surfaces 301TS of the impurity regions 301 may be at a vertical level above a top surface 403TS of the fins 403 and below a vertical level of the top surface 200TS of the gate structure 200. The impurity regions 301 may be formed by an epitaxial growth process such as rapid thermal chemical vapor deposition, low-energy plasma deposition, ultra-high vacuum chemical vapor deposition, atmospheric pressure chemical vapor deposition, or molecular beam epitaxy. In some embodiments, the epitaxial material for a n-type device may include silicon, silicon carbide, phosphorus-doped silicon carbon, phosphorus-doped silicon germanium, silicon phosphide, phosphorus-doped silicon-germanium-tin, or the like, and the epitaxial material for a p-type device may include silicon germanium, boron-doped silicon-germanium, germanium, boron-doped germanium, germanium-tin, boron-doped germanium-tin, a boron-doped III-V compound material, or the like.

In some embodiments, dopants may be incorporated in-situ using appropriate precursors. The dopant concentration of the impurity regions 301 may be between about 1E19 atoms/cm^3 and about 1E21 atoms/cm^3. It should be noted that the term "in-situ" means that the dopant that dictates the conductivity type of a doped layer is introduced during the process step, for example epitaxial deposition, that forms the doped layer. The term "conductivity type" denotes a dopant region being p-type or n-type.

In some embodiments, an epitaxy preclean process may be employed to remove the thin layers of oxide material at the sides 403S of the fins 403. The epitaxy preclean process may be a plasma-assisted dry etch process that involves simultaneous exposure of a substrate to hydrogen, $NF_3$ and $NH_3$ plasma by-products or a wet etch using a solution containing hydrofluoric acid.

With reference to FIG. 2, the gate spacers 207 may be formed on sides 200S of the gate structures 200 and adjacent to the impurity regions 301. The top surfaces 207TS of the gate spacers 207 may be substantially coplanar with the top surface 200TS of the gate structure 200. The gate spacers 207 may have widths between about 3 nm and about 10 nm. The gate spacers 207 may be formed of, for example, silicon nitride, silicon boron carbide nitride, silicon oxy-carbon nitride, silicon carbonitride, silicon carbide oxide, or the like.

With reference to FIG. 2, the inter-gate dielectric layers 405 may be formed on the impurity regions 301 and between the adjacent pairs of the gate structures 200. The inter-gate dielectric layers 405 may be opposite to the gate structures 200 with the gate spacers 207 interposed therebetween. The inter-gate dielectric layers 405 may be formed of, for example, silicon oxide, borophosphosilicate glass, undoped silicate glass, fluorinated silicate glass, low-k dielectric materials, the like, or a combination thereof.

Figure 3:
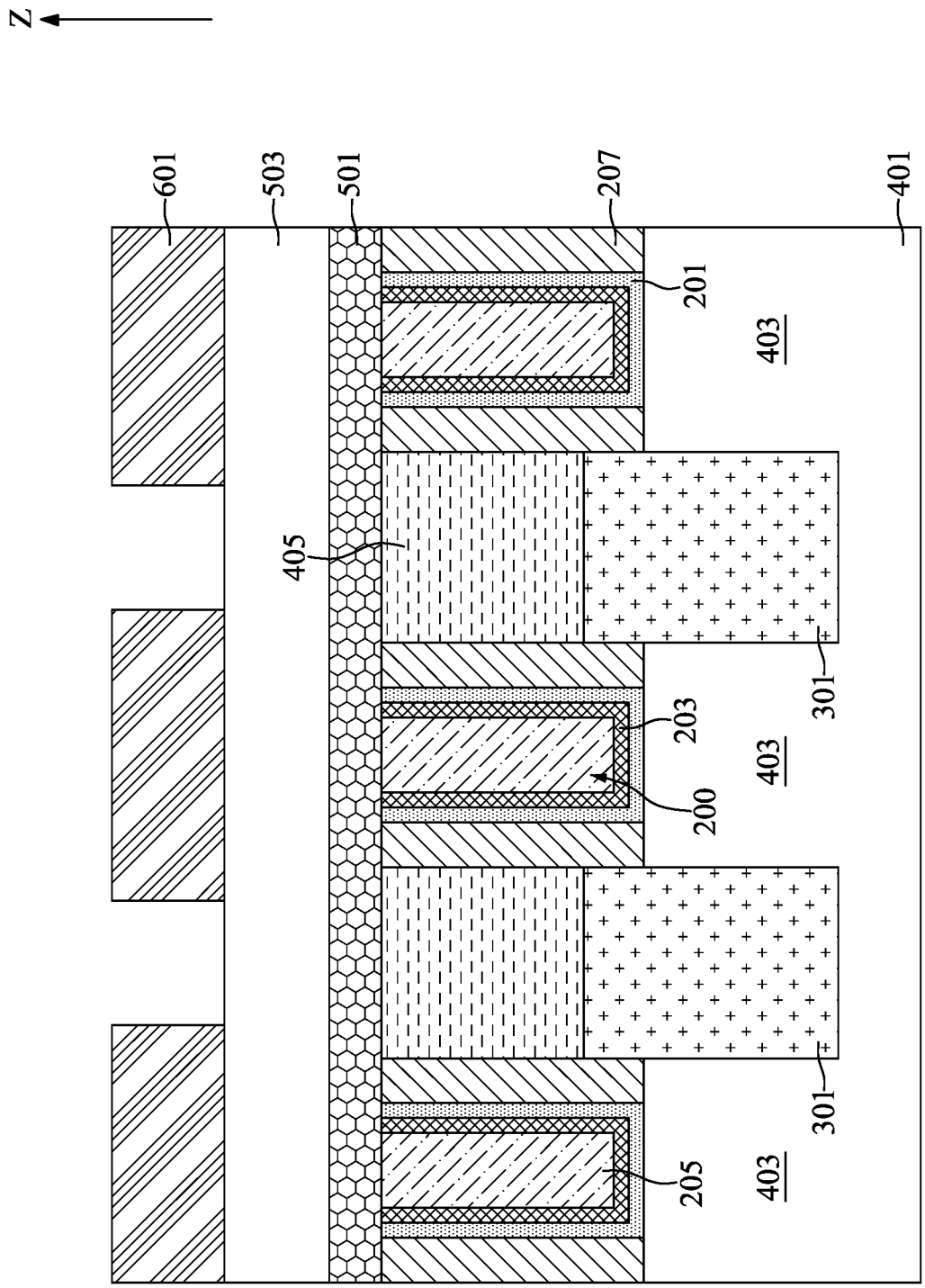
Figure 4:
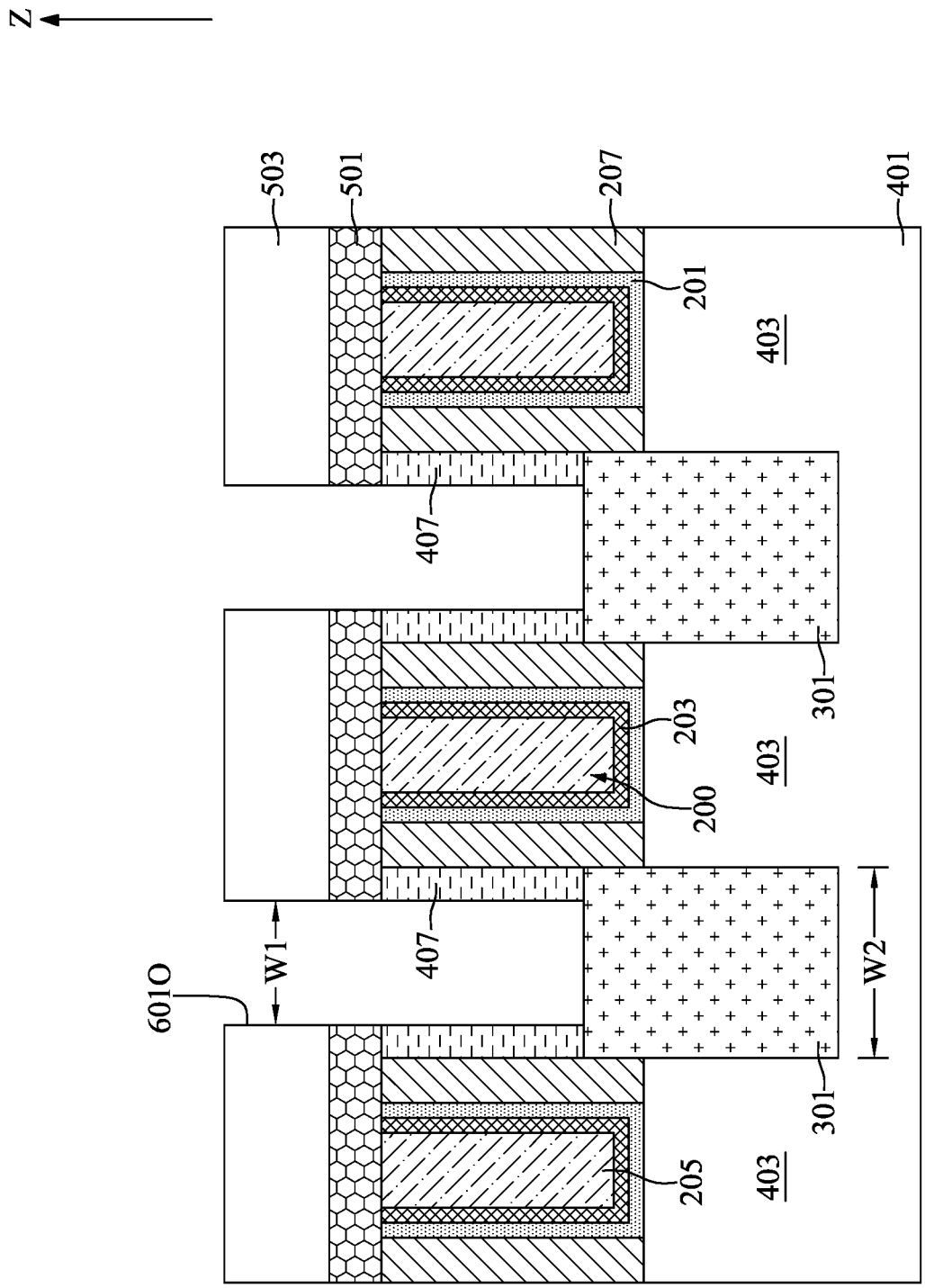

With reference to FIGS. 1, 3, and 4, at step S13, a first dielectric layer 501 may be formed on the gate structures 200, a second dielectric layer 503 may be formed on the first dielectric layer 501, and first openings 6010 may be formed to expose the impurity regions 301.

With reference to FIG. 3, the first dielectric layer 501 may be formed on the gate structures 200, the gate spacers 207, and the inter-gate dielectric layers 405. The first dielectric layer 501 may have a thickness between about 3 nm and about 10 nm, or about 5 nm. The first dielectric layer 501 may be formed by any suitable deposition process, such as atomic layer deposition or chemical vapor deposition. In some embodiments, the first dielectric layer 501 may be formed of, for example, silicon nitride, silicon boron carbon nitride, silicon carbon nitride, or silicon oxy-carbon nitride. In some embodiments, the first dielectric layer 501 may be formed of, for example, silicon oxide, borophosphosilicate glass, undoped silicate glass, fluorinated silicate glass, low-k dielectric materials, silicon nitride, silicon nitride oxide, silicon boron carbon nitride, silicon carbon nitride, or silicon oxy-carbon nitride.

With reference to FIG. 3, the second dielectric layer 503 may be formed on the first dielectric layer 501. The second dielectric layer 503 may have a thickness between about 10 nm and about 30 nm. The second dielectric layer 503 may be formed by any suitable deposition process, such as atomic layer deposition or chemical vapor deposition. In some embodiments, the second dielectric layer 503 may be formed of a material having etching selectivity to the first dielectric layer 501. In some embodiments, the second dielectric layer 503 may be formed of an oxide such as silicon oxide.

With reference to FIG. 3, a first mask layer 601 may be formed on the second dielectric layer 503. In some embodiments, the first mask layer 601 may be a photoresist layer. In some embodiments, the first mask layer 601 may include a hard mask layer on the second dielectric layer 503 and a photoresist layer on the hard mask layer. The first mask layer 601 may have a pattern of the first openings 6010.

With reference to FIG. 4, an etch process may be performed to remove portions of the second dielectric layer 503, portions of the first dielectric layer 501, and portions of the inter-gate dielectric layers 405 to form the first openings 6010. In other words, the first openings 6010 may be disposed along the second dielectric layer 503, the first dielectric layer 501, and the inter-gate dielectric layers 405. The impurity regions 301 may be exposed through the first openings 6010. The widths W1 of the first openings 6010 may be less than the widths W2 of the impurity regions 301. The inter-gate dielectric layers 405 may be divided by the first openings 6010 and turned into contact spacers 407 adjacent to the gate spacers 207. The first mask layer 601 may be removed after the formation of the first openings 6010.

Figure 5:
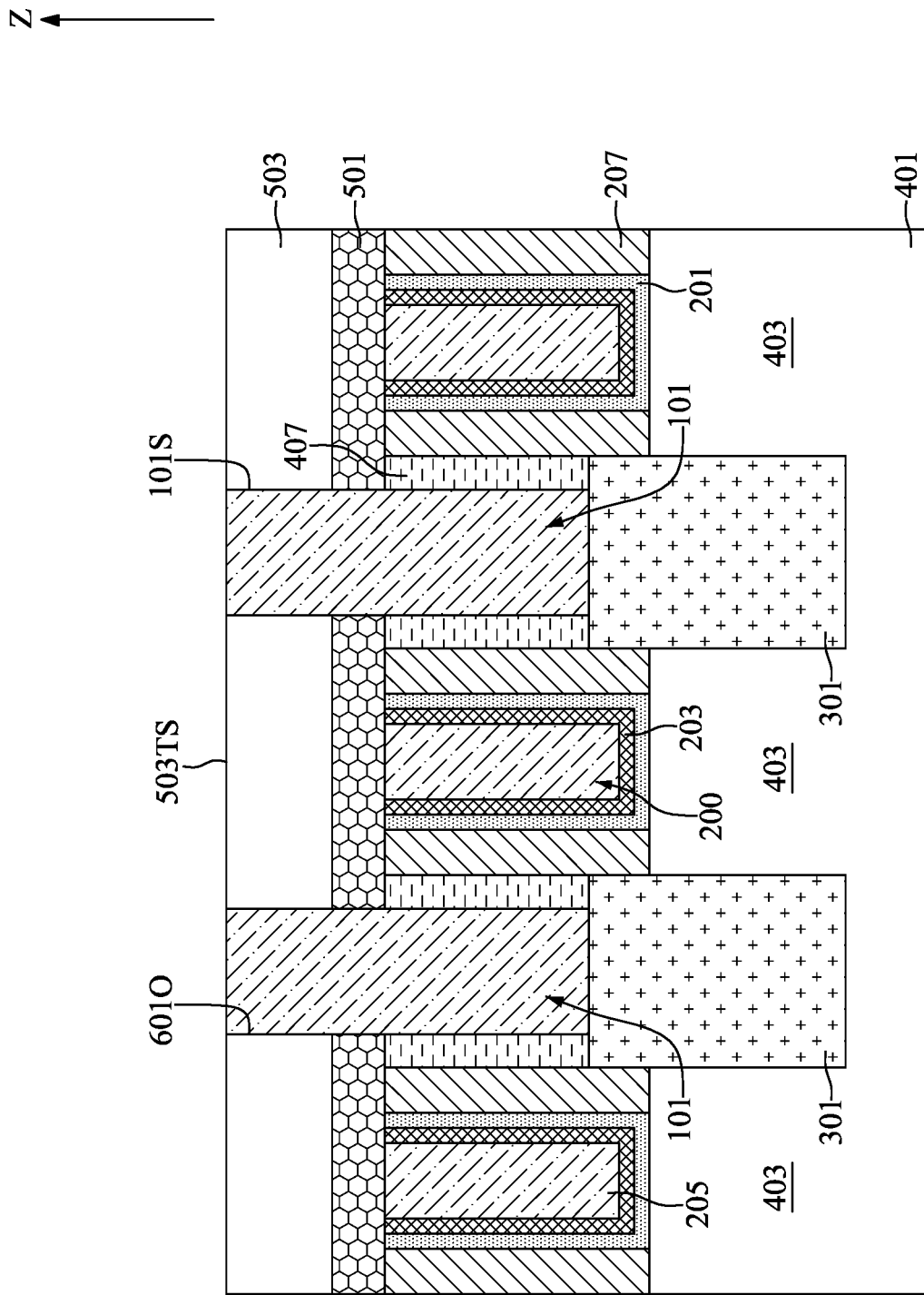

With reference to FIGS. 1 and 5, at step S15, contacts 101 may be formed in the first openings 6010.

With reference to FIG. 5, a conductive material such as tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof may be deposited into the first openings 6010 by a deposition process. After the deposition process, a planarization process, such as chemical mechanical polishing, may be performed until the top surface 503TS of the second dielectric layer 503 is exposed to remove excess material, provide a substantially flat surface for subsequent processing steps, and concurrently form the contacts 101. The contacts 101 may be electrically coupled to the impurity regions 301. The contact spacers 407 may be disposed on sides 101S of the contacts 101 and between the first dielectric layer 501 and the impurity regions 301 to electrically isolate the contacts 101 and the gate structures 200.

Figure 6:
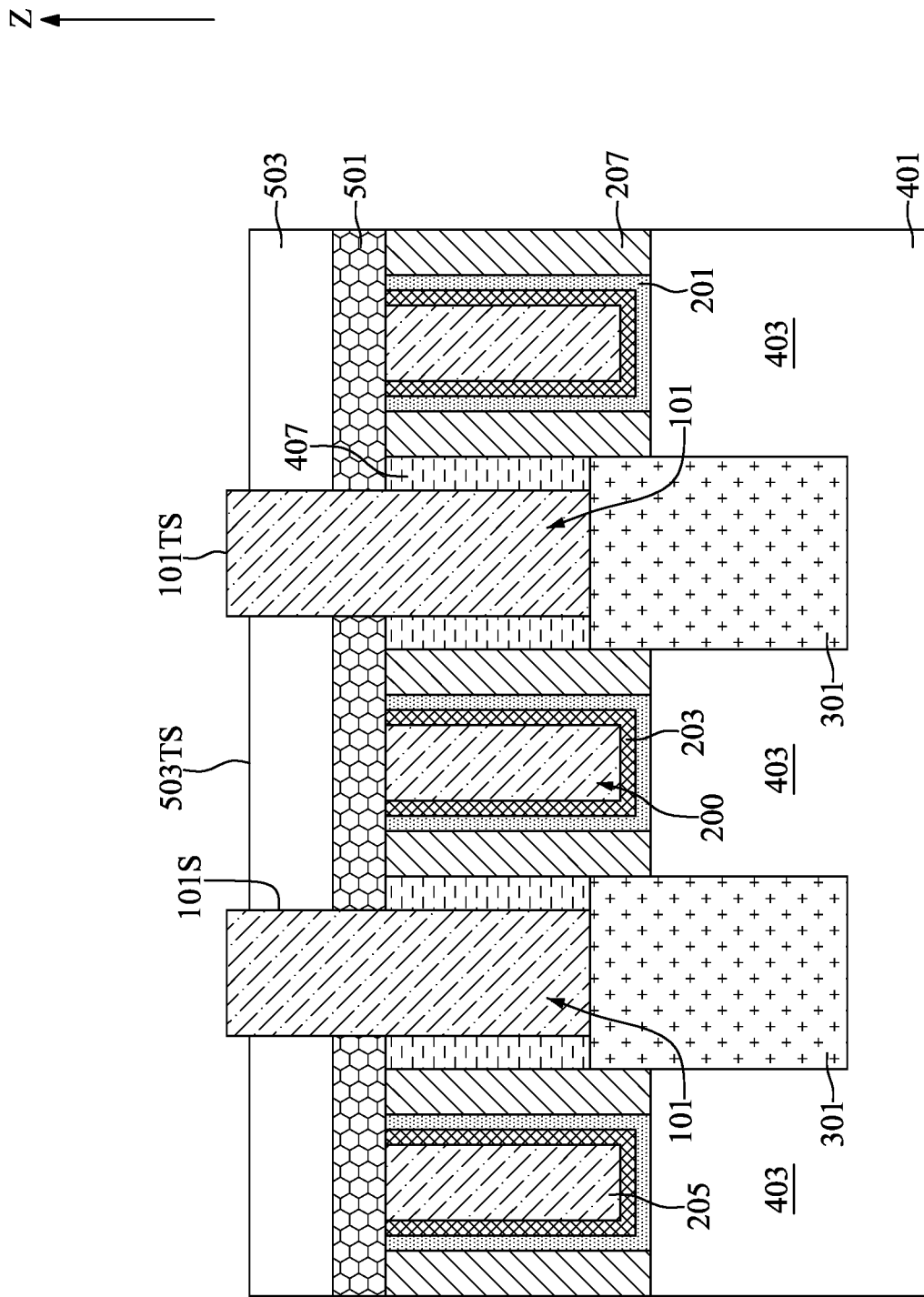

With reference to FIGS. 1 and 6, at step S17, the second dielectric layer 503 may be recessed to expose upper parts of sides 101S of the contacts 101.

With reference to FIG. 6, an etch process may be performed to recess the top surface 503TS of the second dielectric layer 503. The etch rate ratio of the second dielectric layer 503 to the contacts 101 may be between about 100:1 and about 1.05:1, between about 15:1 and about 2:1, or between about 10:1 and about 2:1 during the etch process. The upper parts of the sides 101S of the contacts 101 may protrude from the top surface 503TS of the second dielectric layer 503 after the etch process. In other words, the top surfaces 101TS of the contacts 101 may be at a vertical level above a vertical level of the top surface 503TS of the second dielectric layer 503.

Figure 7:
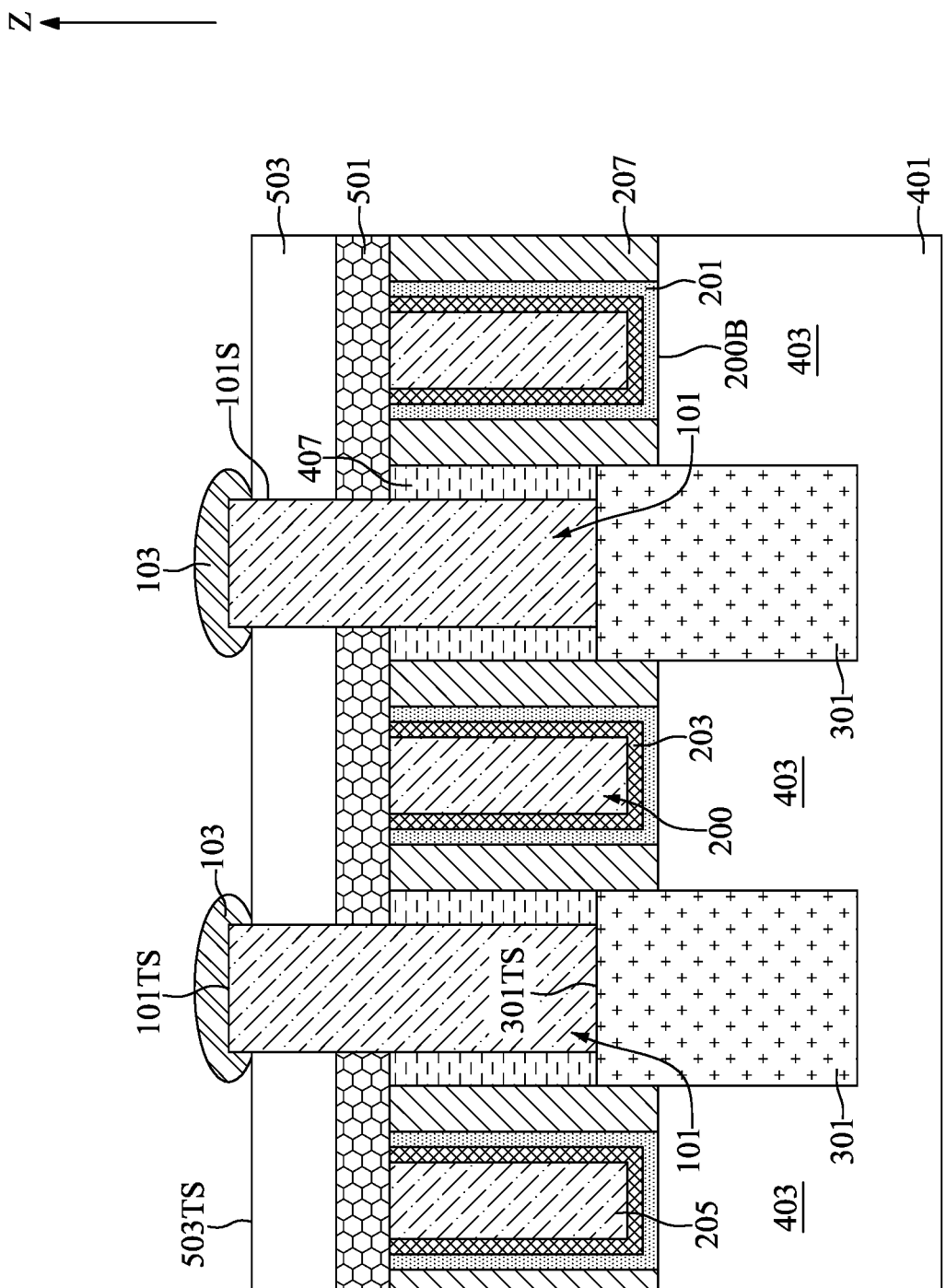

With reference to FIGS. 1 and 7, at step S19, conductive covering layers 103 may be formed on the contacts 101.

With reference to FIG. 7, the conductive covering layers 103 may be formed on the top surfaces 101TS of the contacts 101, selectively on the upper parts of the sides 101S of the contacts 101, and on the second dielectric layer 503. The conductive covering layers 103 may be formed of, for example, copper germanide ($Cu_3Ge$). In some embodiments, the conductive covering layers 103 may be formed by, for example, sputtering, electron beam thermal evaporation, vapor-solid reaction, or epitaxial growth. In the present embodiments, the conductive covering layers 103 formed of epitaxial growth may be preferred to provide lower electrical resistivity.

In one embodiment, the contact 101 comprises copper, and the formation of the conductive covering layers 103 may comprise applying germane ($GeH_4$) to the resultant structure in FIG. 6. Germane reacts with the exposed surface of the contact 101 and generates a layer of copper germanide covering the exposed surface of the contact 101. Since germane does not react with the second dielectric layer 503, the conductive covering layers 103 ($Cu_3Ge$ layer) can be formed selectively on the exposed surface of the contact 101. Thus, the manufacturing process can be simplified because no patterning is needed. Moreover, because of the high selectivity of the abovementioned chemical reaction, the conductive covering layers 103 ($Cu_3Ge$ layer) is formed in a self-aligning manner and unwanted connections between the contacts such as the stringer or bridge phenomenon due to defects in the patterning process can be avoided. Other selective processes can also be applied to form the conductive covering layers 103. In one embodiment of the present disclosure, electroplating may be used to generate the conductive covering layers 103. Since the contact 101 is highly conductive compared to the second dielectric layer 503, an electroplating process can also be used to form a highly selective layer on the second part 142 of the plug 140.

The conductive covering layers 103 formed of copper germanide, which has high thermal stability, low bulk resistivity, and diffusion barrier property, may reduce the contact resistance between the contacts 101 and conductive features to be electrically connected to the contacts 101. The conductive covering layers 103 may be referred to as resistance reduction elements.

In some embodiments, one of dielectric layer may be omitted. For example, the second dielectric layer 503 may be omitted. The contacts 101 may protrude from the top surface 501TS of the first dielectric layer 501. The conductive covering layers 103 may be formed on the top surfaces 101TS of the contacts 101, on the upper parts of the sides 101S of the contacts 101, and on the first dielectric layer 501. For another example, the first dielectric layer 501 may be omitted.

Figure 8:
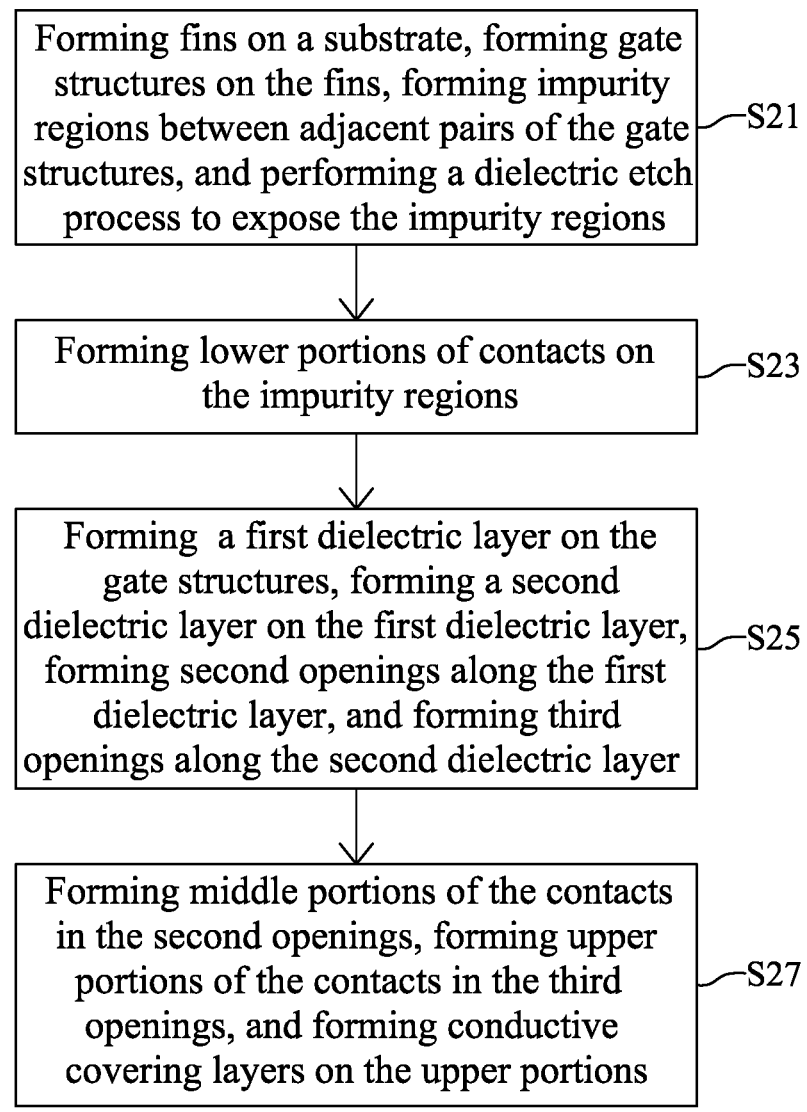
FIG. 8 illustrates, in a flowchart diagram form, a method for fabricating a semiconductor device in accordance with another embodiment of the present disclosure.

FIG. 8 illustrates, in a flowchart diagram form, a method 20 for fabricating a semiconductor device 1B in accordance with another embodiment of the present disclosure. FIGS. 9 to 15 illustrate, in schematic cross-sectional view diagrams, a flow for fabricating the semiconductor device 1B in accordance with another embodiment of the present disclosure.

Figure 9:
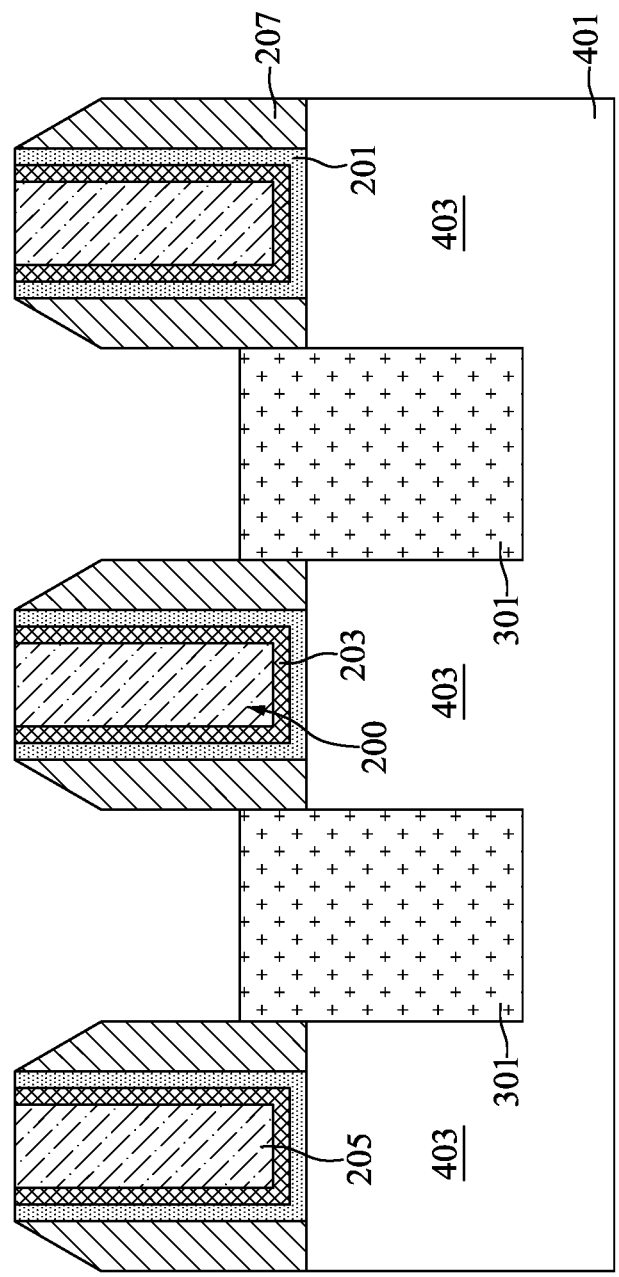
FIGS. 9 to 15 illustrate, in schematic cross-sectional view diagrams, a flow for fabricating the semiconductor device in accordance with another embodiment of the present disclosure.

With reference to FIGS. 8 and 9, at step S21, fins 403 may be formed on a substrate 401, gate structures 200 may be formed on the fins 403, and impurity regions 301 may be formed between adjacent pairs of the gate structures 200, and a dielectric etch process may be performed to expose the impurity regions 301.

With reference to FIG. 9, an intermediate semiconductor device may be fabricated with a procedure similar to that illustrated in FIG. 2. The inter-gate dielectric layers 405 (as shown in FIG. 2) may be removed after the dielectric etch process. The etch rate ratio of the inter-gate dielectric layers 405 to the gate spacers 207 may be between about 100:1 and about 1.05:1, between about 15:1 and about 2:1, or between about 10:1 and about 2:1 during the dielectric etch process. The etch rate ratio of the inter-gate dielectric layers 405 to the gate structures 200 may be between about 100:1 and about 1.05:1, between about 15:1 and about 2:1, or between about 10:1 and about 2:1 during the dielectric etch process. The etch rate ratio of the inter-gate dielectric layers 405 to the impurity regions 301 may be between about 100:1 and about 1.05:1, between about 15:1 and about 2:1, or between about 10:1 and about 2:1 during the dielectric etch process. Corner erosion of the gate spacers 207 may be occurred after the dielectric etch process.

Figure 10:
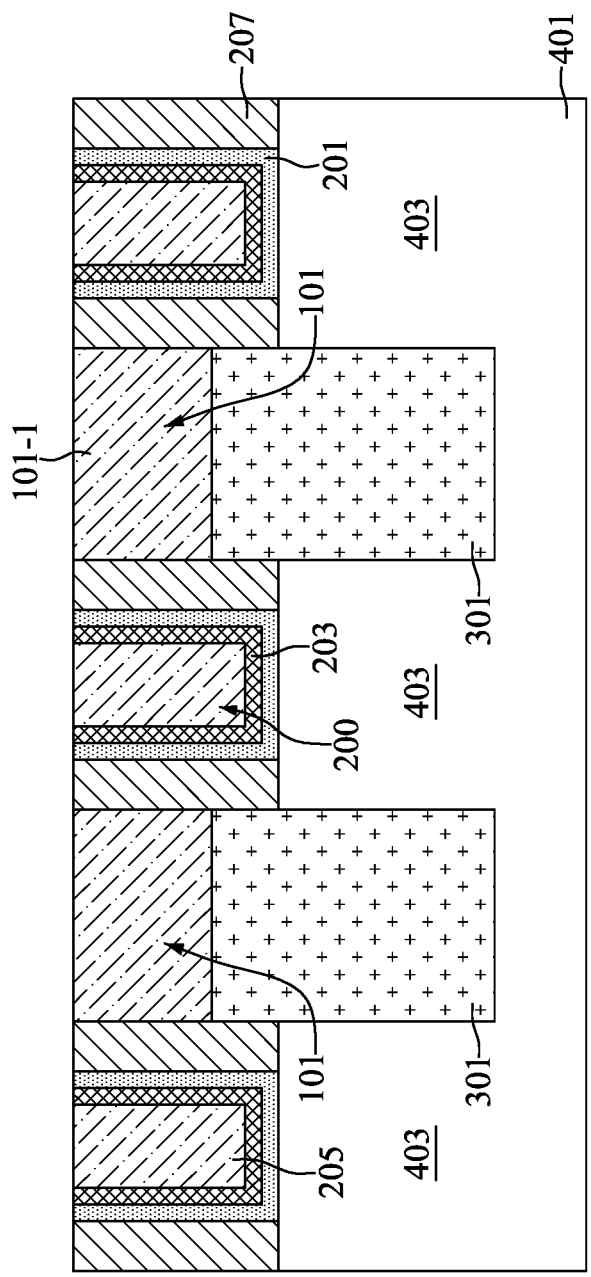

With reference to FIGS. 8 and 10, at step S23, lower portions 101-1 of contacts 101 may be formed on the impurity regions 301.

With reference to FIG. 10, a contact material may be deposited to overfill the intermediate semiconductor device illustrated in FIG. 9. A planarization process, such as chemical mechanical polishing, may be subsequently performed to remove excess material, provide a substantially flat surface for subsequent processing steps, and concurrently form the lower portions 101-1 of the contacts 101. The planarization process may "over polish" to remove the portions of the gate spacers 207 having eroded corners. The lower portions 101-1 of the contacts 101 may be disposed opposite the gate structures 200 with the gate spacers 207 interposed therebetween. It should be noted that no contact spacers are disposed on the sides the contacts 101 comparing to FIG. 7.

With reference to FIG. 8 and FIGS. 11 to 13, at step S25, a first dielectric layer 501 may be formed on the gate structures 200, a second dielectric layer 503 may be formed on the first dielectric layer 501, second openings 6030 may be formed along the first dielectric layer 501, and third openings 6050 may be formed along the second dielectric layer 503.

Figure 11:
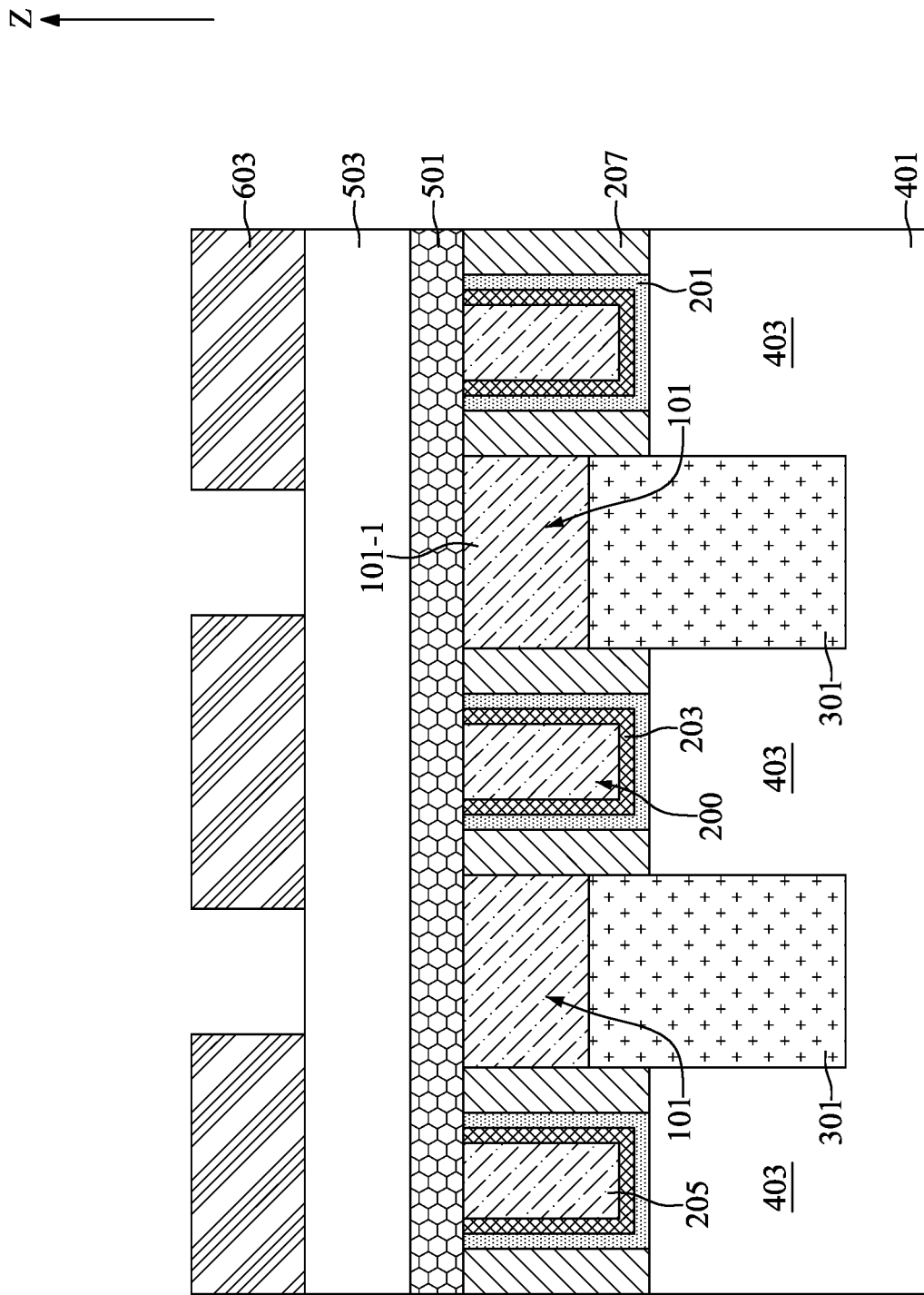

With reference to FIG. 11, the first dielectric layer 501 may be formed on the gate structures 200, on the gate spacers 207, and on the lower portions 101-1 of the contacts 101. The first dielectric layer 501 may have a thickness between about 3 nm and about 10 nm, or about 5 nm. The first dielectric layer 501 may be formed by any suitable deposition process, such as atomic layer deposition or chemical vapor deposition. In some embodiments, the first dielectric layer 501 may be formed of, for example, silicon nitride, silicon boron carbon nitride, silicon carbon nitride, or silicon oxy-carbon nitride. In some embodiments, the first dielectric layer 501 may be formed of, for example, silicon oxide, borophosphosilicate glass, undoped silicate glass, fluorinated silicate glass, low-k dielectric materials, silicon nitride, silicon nitride oxide, silicon boron carbon nitride, silicon carbon nitride, or silicon oxy-carbon nitride.

With reference to FIG. 11, the second dielectric layer 503 may be formed on the first dielectric layer 501. The second dielectric layer 503 may have a thickness between about 10 nm and about 30 nm. The second dielectric layer 503 may be formed by any suitable deposition process, such as atomic layer deposition or chemical vapor deposition. In some embodiments, the second dielectric layer 503 may be formed of a material having etching selectivity to the first dielectric layer 501. In some embodiments, the second dielectric layer 503 may be formed of an oxide such as silicon oxide.

With reference to FIG. 11, a second mask layer 603 may be formed on the second dielectric layer 503. In some embodiments, the second mask layer 603 may be a photoresist layer. In some embodiments, the second mask layer 603 may include a hard mask layer on the second dielectric layer 503 and a photoresist layer on the hard mask layer. The second mask layer 603 may have a pattern of the second openings 6030.

Figure 12:
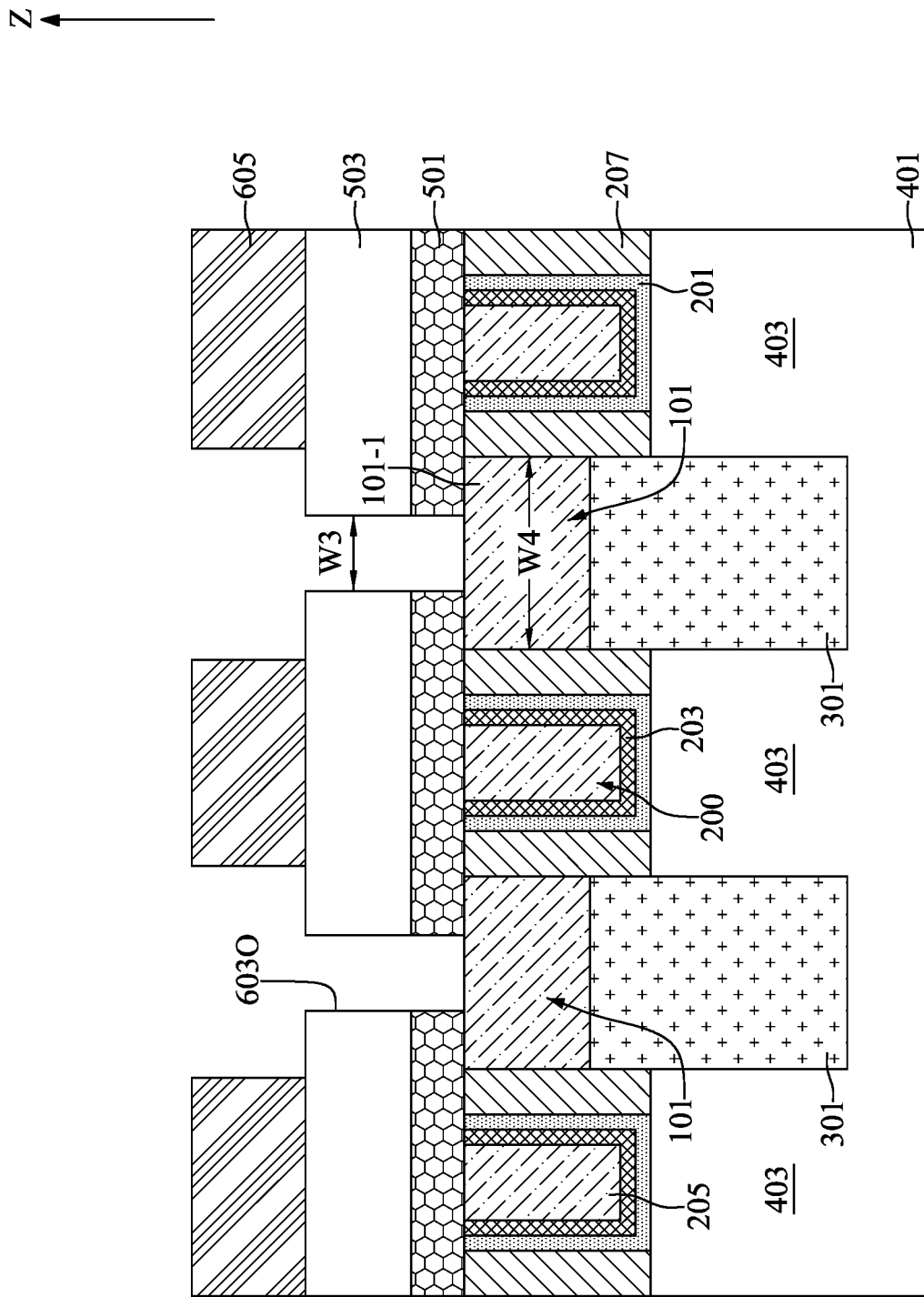

With reference to FIG. 12, a first etch process may be performed to remove portions of the second dielectric layer 503 and portions of the first dielectric layer 501 to form the second openings 6030. In current stage, the second openings 6030 may be disposed along the second dielectric layer 503 and the first dielectric layer 501. The lower portions 101-1 of the contacts 101 may be exposed through the second openings 6030. The widths W3 of the second openings 6030 may be less than the widths W4 of the lower portions 101-1 of the contacts 101. The second mask layer 603 may be removed after the formation of the second openings 6030.

With reference to FIG. 12, a third mask layer 605 may be formed on the second dielectric layer 503. In some embodiments, the third mask layer 605 may be a photoresist layer. In some embodiments, the third mask layer 605 may include a hard mask layer on the second dielectric layer 503 and a photoresist layer on the hard mask layer. The third mask layer 605 may have a pattern of the third openings 6050.

Figure 13:
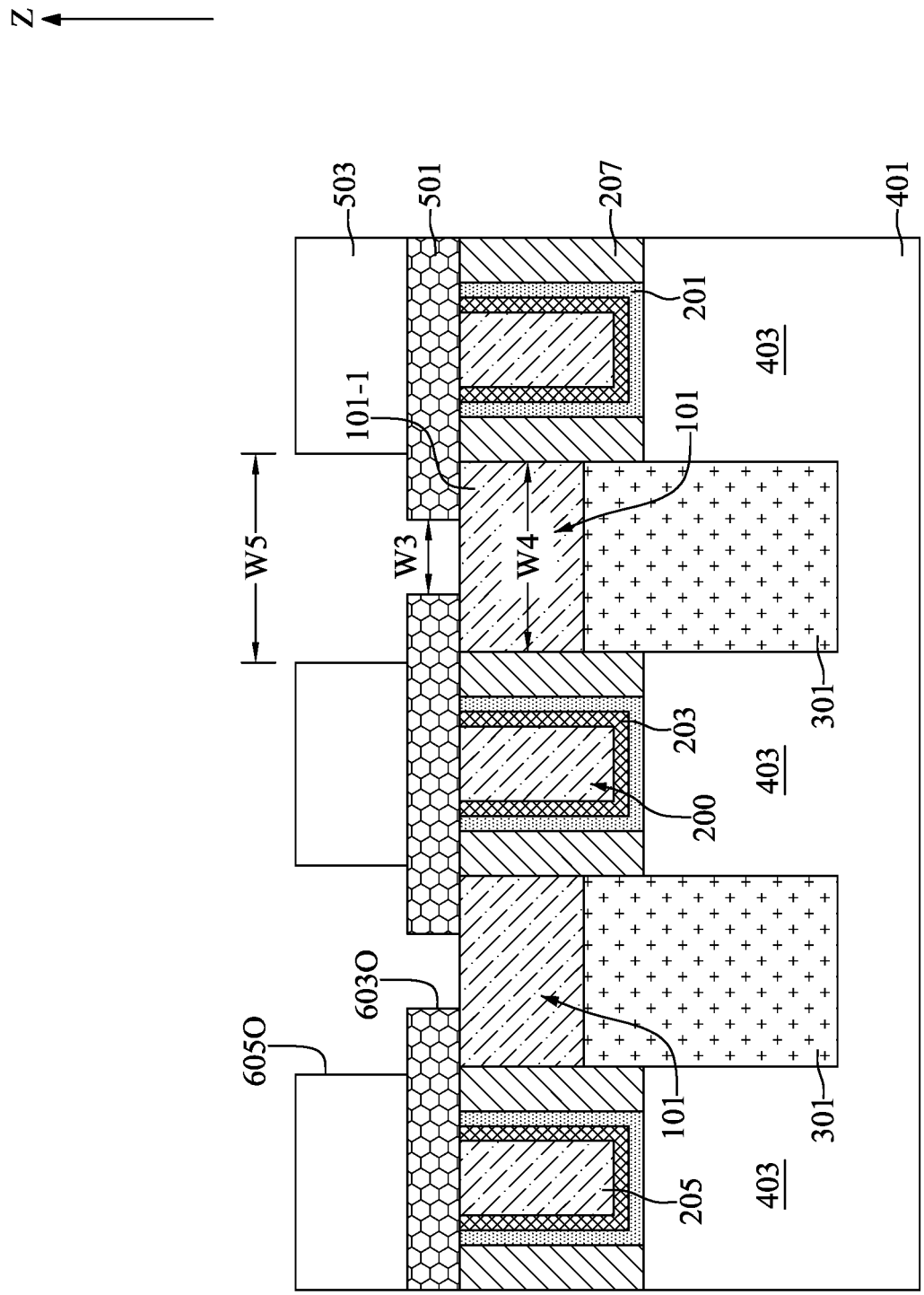

With reference to FIG. 13, a second etch process may be performed to remove portions of the second dielectric layer 503 to form the third openings 6050. The third openings 6050 may be broaden from the second openings 6030 along the second dielectric layer 503. The widths W5 of the third openings 6050 may be greater than the widths W3 of the second openings 6030. In some embodiments, the widths W5 of the third openings 6050 may be equal to or greater than the widths W4 of the lower portions 101-1 of the contacts 101.

Figure 14:
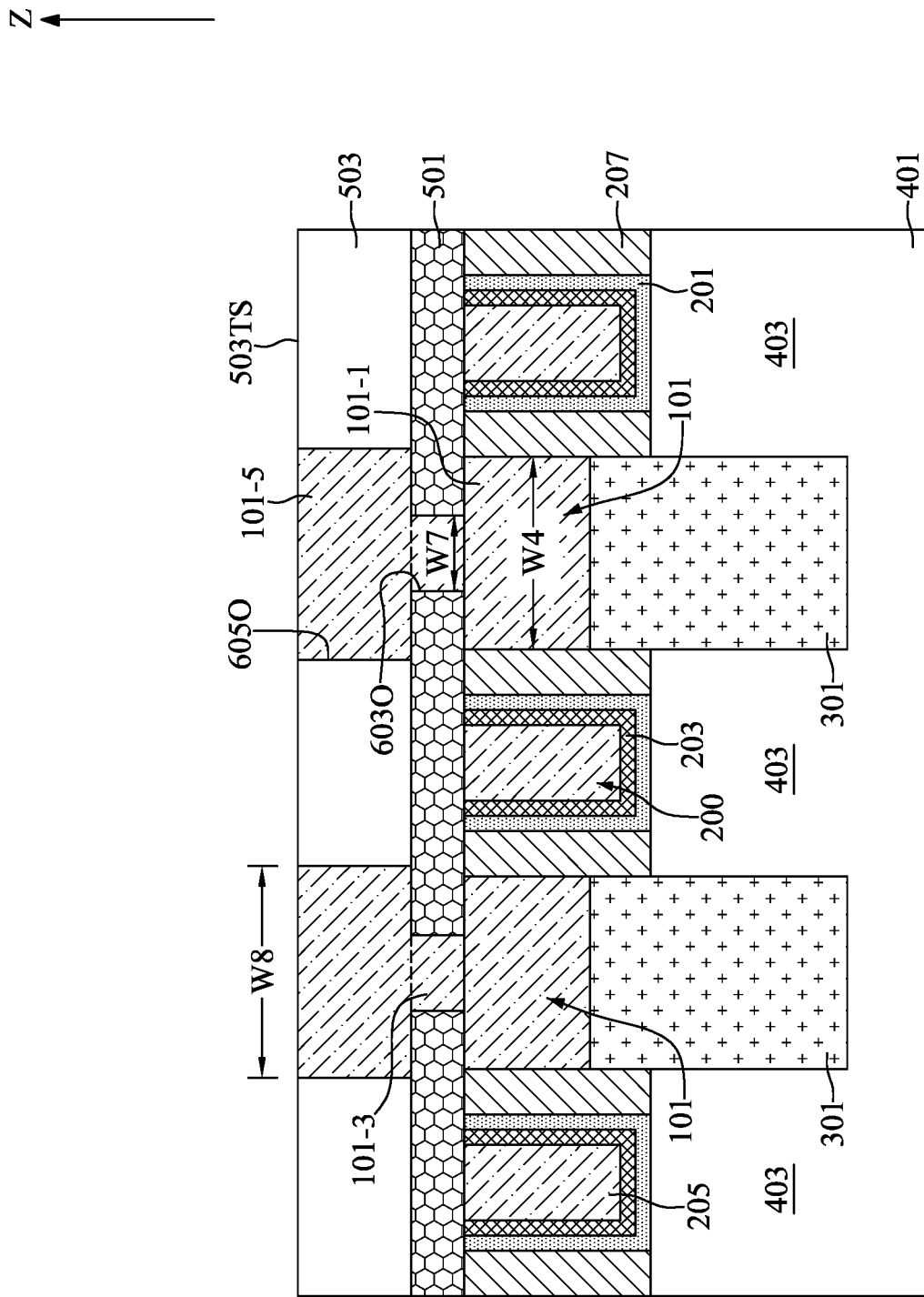
Figure 15:
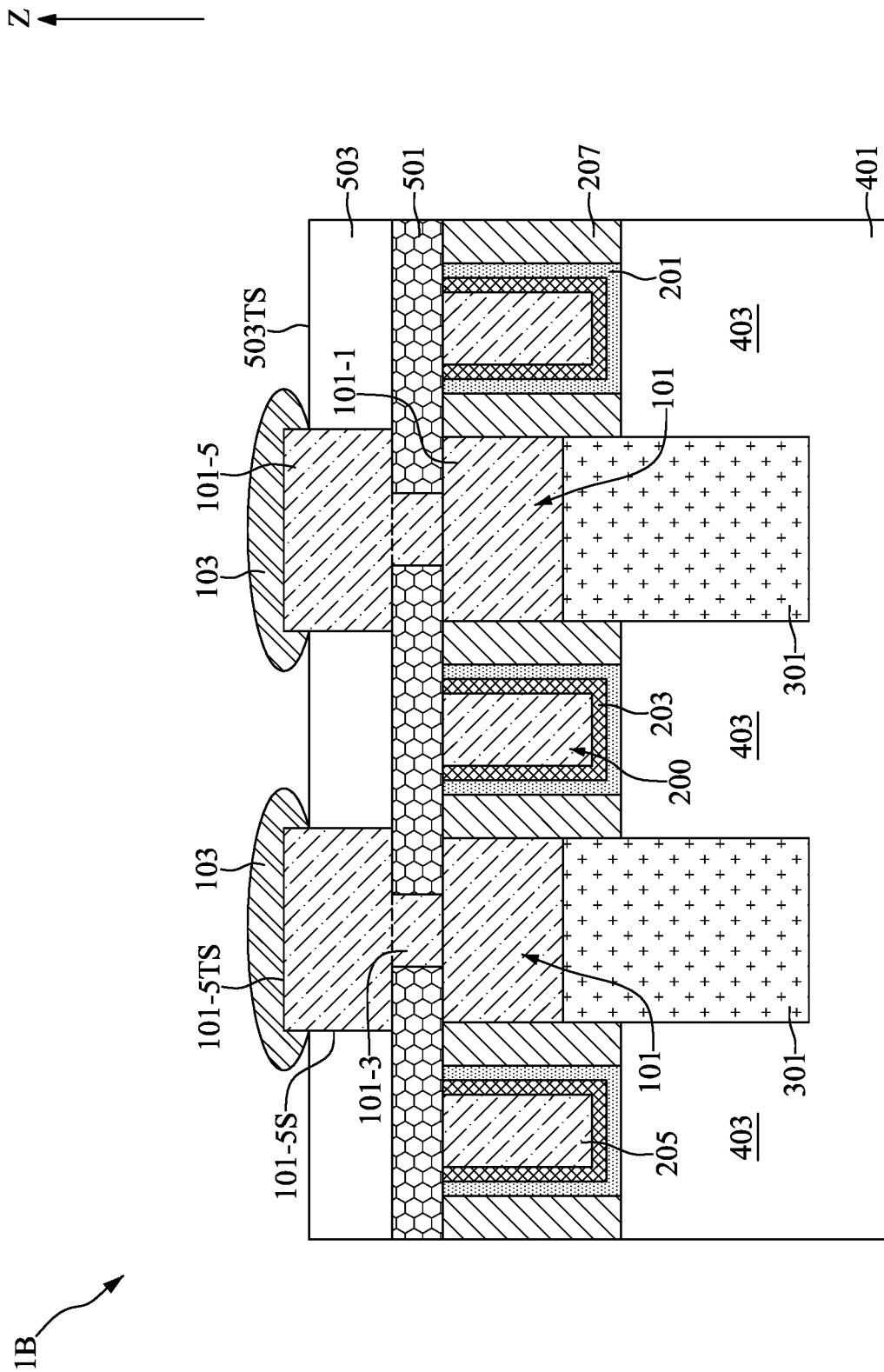

With reference to FIGS. 8, 14, and 15, at step S27, middle portions 101-3 of the contacts 101 may be formed in the second openings 6030, upper portions 101-5 of the contacts 101 may be formed in the third openings 6050, and conductive covering layers 103 may be formed on the upper portions 101-5.

With reference to FIG. 14, a conductive material such as tungsten, cobalt, zirconium, tantalum, titanium, aluminum, ruthenium, copper, metal carbides, metal nitrides, transition metal aluminides, or combinations thereof may be deposited into the second openings 6030 and the third openings 6050 by a deposition process. After the deposition process, a planarization process, such as chemical mechanical polishing, may be performed until the top surface 503TS of the second dielectric layer 503 is exposed to remove excess material, provide a substantially flat surface for subsequent processing steps, and concurrently form the middle portion 101-3 of the contacts 101 in the second openings 6030 and the upper portions 101-5 of the contacts 101 in the third openings 6050.

The widths (or dimension) of the contacts 101 may be critical. If the widths of the contacts 101 to the impurity regions 301 is too small, there is no shorting to the gate structures 200 but the contact resistance may be high. If the widths of the contacts 101 to the impurity regions 301 is too large, there is low contact resistance but the possibility of shorting to the gate structures 200. With reference to FIG. 14, the widths W8 of the upper portions 101-5 may be greater than the widths W7 of the middle portion 101-3. In some embodiments, the widths W8 of the upper portions 101-5 may be equal to or greater than the widths W4 of the lower portions 101-1. In the present embodiment, the wider widths of the lower portions 101-1 and the wider widths of the upper portions 101-5 may reduce the contact resistance by increasing the contact area. Meanwhile, the narrower widths of the middle portion 101-3 may avoid increasing the likelihood or probability of shorting to the gate structures 200. Accordingly, the total contact resistance of the semiconductor device 1B with current design of the contacts 101 may be reduced.

With reference to FIG. 15, an etch process may be performed to recess the top surface 503TS of the second dielectric layer 503. The upper parts of the sides 101-5S of the upper portions 101-5 may protrude from the top surface 503TS of the second dielectric layer 503 after the etch process. In other words, the top surfaces 101-5TS of the upper portions 101-5 may be at a vertical level above a vertical level of the top surface 503TS of the second dielectric layer 503.

With reference to FIG. 15, the conductive covering layers 103 may be formed on the top surfaces 101-5TS of the upper portions 101-5, selectively on the upper parts of the sides 101-5S of the upper portions 101-5, and on the second dielectric layer 503. The conductive covering layers 103 may be formed of, for example, copper germanide. In some embodiments, the conductive covering layers 103 may be formed by, for example, sputtering, electron beam thermal evaporation, vapor-solid reaction, or epitaxial growth. In the present embodiments, the conductive covering layers 103 formed of epitaxial growth may be preferred to provide lower electrical resistivity.

The conductive covering layers 103 formed of copper germanide, which has high thermal stability, low bulk resistivity, and diffusion barrier property, may further reduce the contact resistance between the upper portions 101-5 of the contacts 101 and conductive features to be electrically connected to the contacts 101.

FIGS. 16 to 19 illustrate, in schematic cross-sectional view diagrams, a flow for fabricating the semiconductor device 1C in accordance with another embodiment of the present disclosure.

Figure 16:
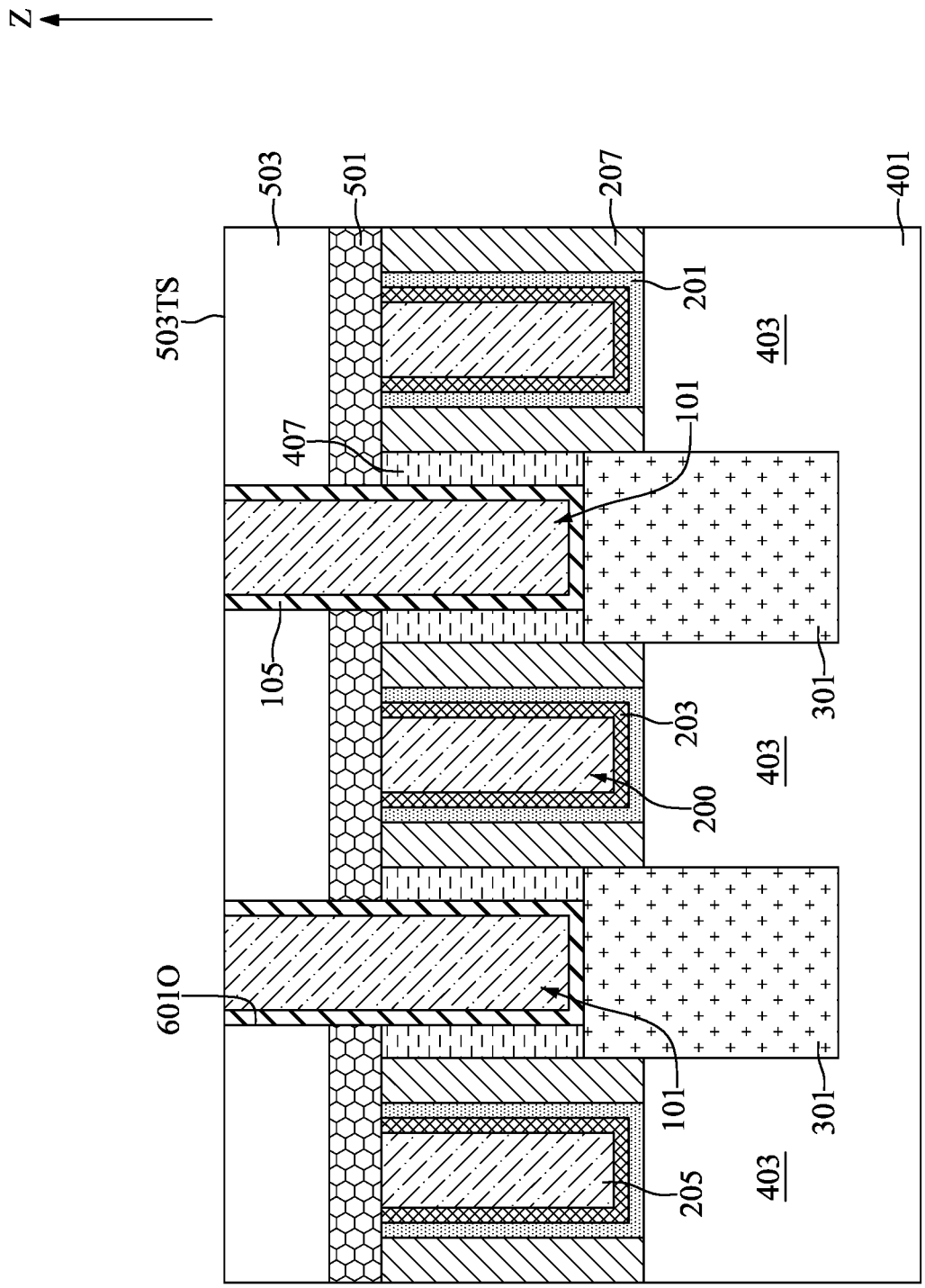
FIGS. 16 to 19 illustrate, in schematic cross-sectional view diagrams, a flow for fabricating the semiconductor device in accordance with another embodiment of the present disclosure.

With reference to FIG. 16, an intermediate semiconductor device may be fabricated with a procedure similar to that illustrated in FIGS. 2 to 4. A barrier material may be conformally formed in the first openings 6010 and on the top surface 503TS of the second dielectric layer 503. The barrier material may be, for example, titanium, titanium nitride, platinum, nickel, or a combination thereof. In the present embodiment, the barrier material may be titanium. Subsequently, a conductive material such as tungsten, cobalt, zirconium, tantalum, titanium, aluminum, ruthenium, copper, metal carbides, metal nitrides, transition metal aluminides, or combinations thereof may be deposited into the first openings 6010 by a deposition process. After the deposition process, a planarization process, such as chemical mechanical polishing, may be performed until the top surface 503TS of the second dielectric layer 503 to remove excess material, provide a substantially flat surface for subsequent processing steps, and concurrently form the contacts 101 and turn the barrier material into barrier layers 105.

Figure 17:
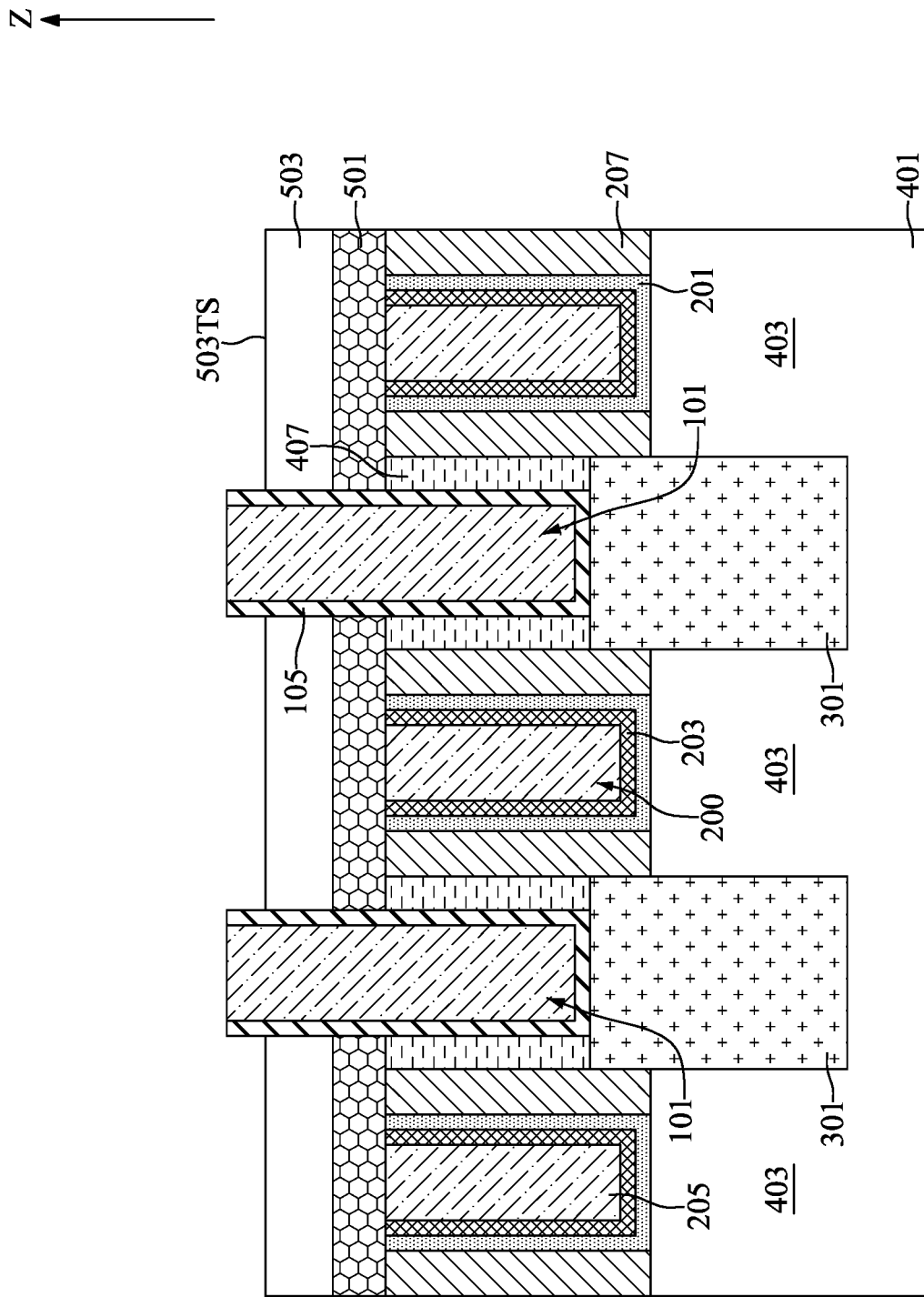

With reference to FIG. 17, an etch process may be performed to recess the top surface 503TS of the second dielectric layer 503. The etch rate ratio of the second dielectric layer 503 to the contacts 101 may be between about 100:1 and about 1.05:1, between about 15:1 and about 2:1, or between about 10:1 and about 2:1 during the etch process. The etch rate ratio of the second dielectric layer 503 to the barrier layers 105 may be between about 100:1 and about 1.05:1, between about 15:1 and about 2:1, or between about 10:1 and about 2:1 during the etch process. The upper parts of the contacts 101 and the upper parts of the barrier layers 105 may protrude from the top surface 503TS of the second dielectric layer 503 after the etch process.

Figure 18:
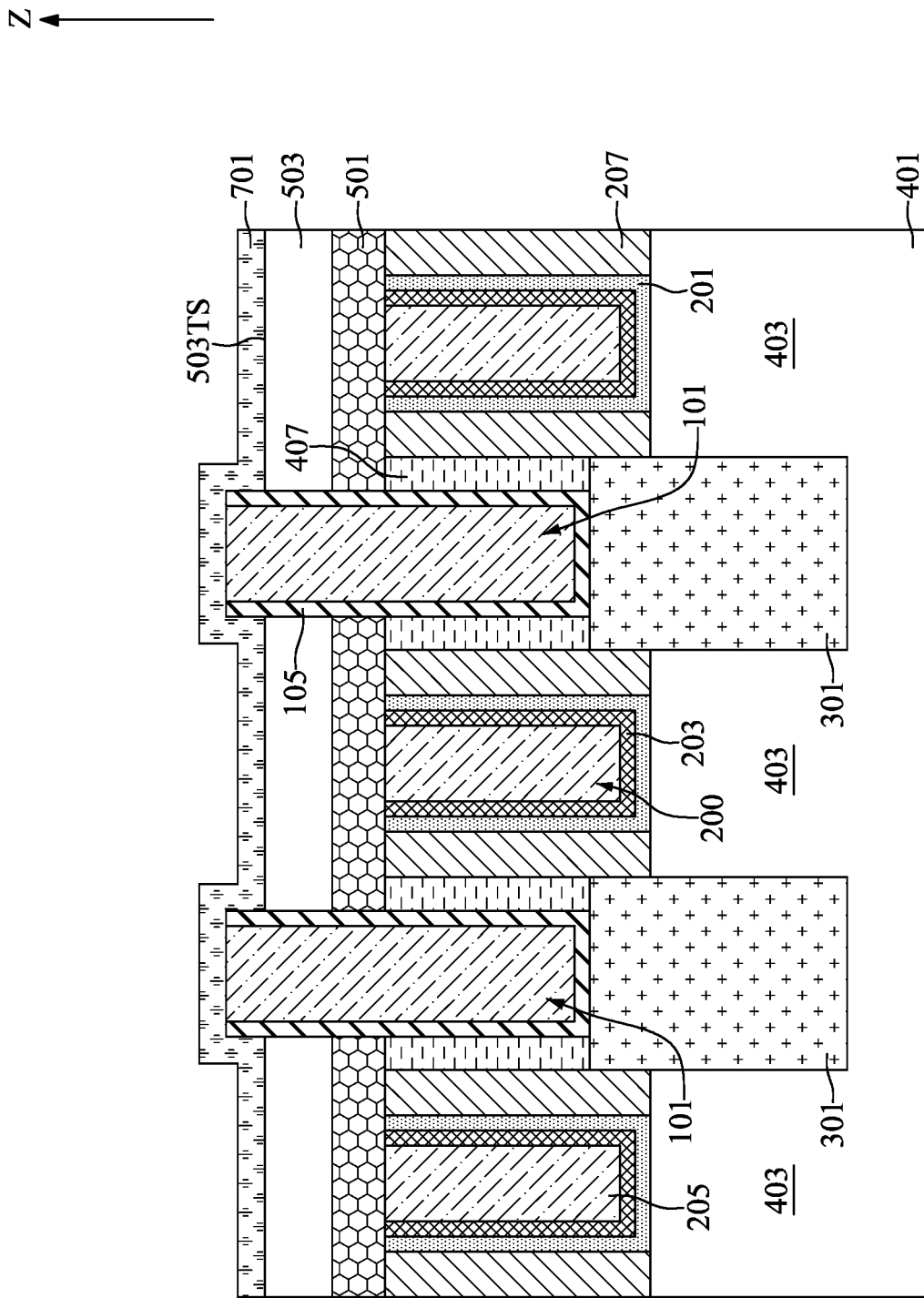

With reference to FIG. 18, a layer of semiconductor material 701 may be conformally formed to cover the top surface 503TS of second dielectric layer 503, the upper parts of the contacts 101, and the upper parts of the barrier layers 105. The semiconductor material 701 may be, for example, silicon or germanium. In the present embodiment, the semiconductor material 701 may be silicon.

Figure 19:
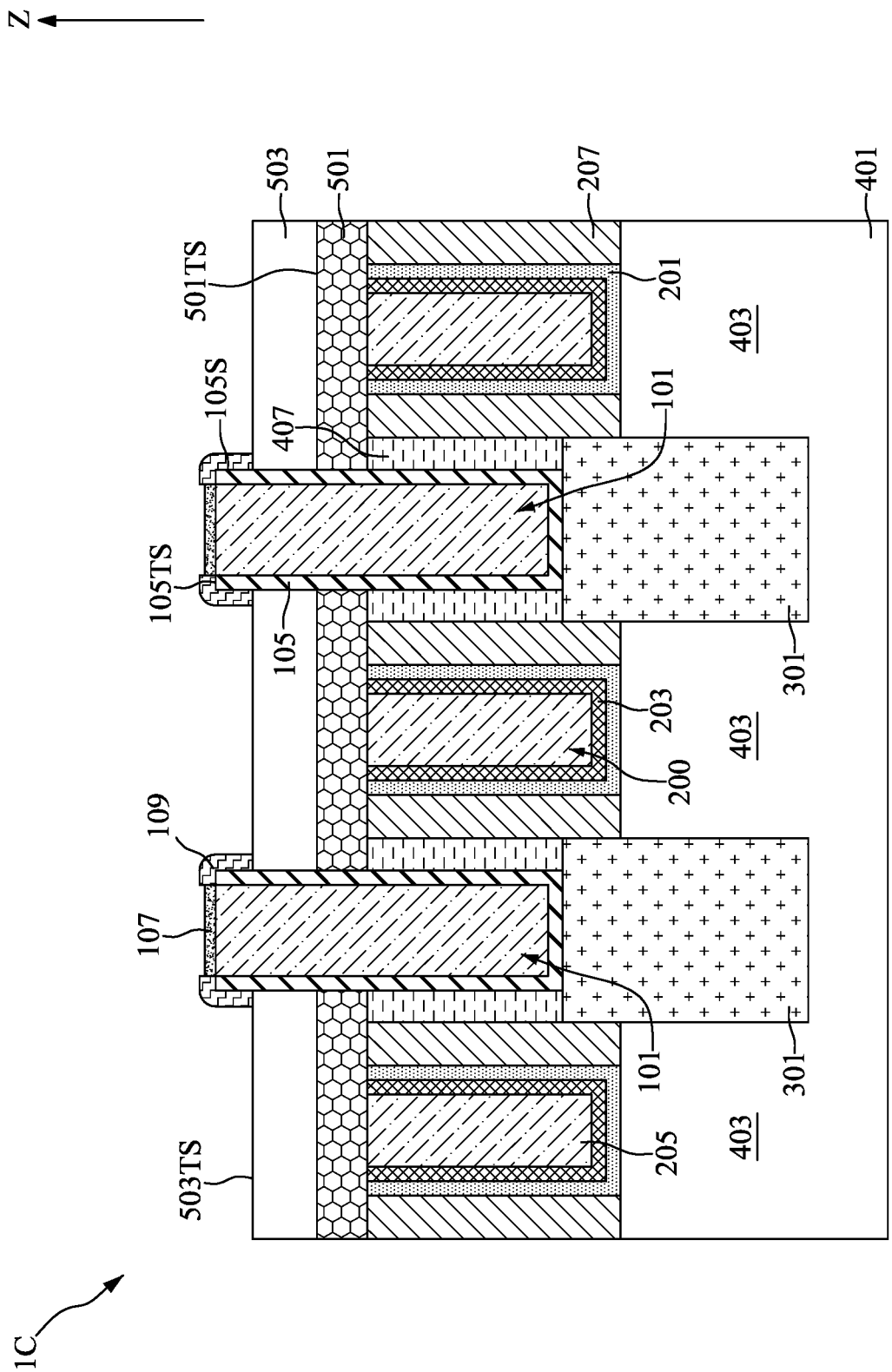

With reference to FIG. 19, a thermal treatment may be performed. During the thermal treatment, metal atoms of the contacts 101 and the barrier layers 105 may react chemically with silicon atoms of the layer of semiconductor material 701 to form the top conductive layers 107 on the contacts 101 and the barrier spacers 109 on the sides 105S and the top surfaces 105TS of barrier layers 105. The top conductive layers 107 and the barrier spacers 109 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted semiconductor material 701. The cleaning process may be, for example, wet etch using potassium hydroxide. The top conductive layers 107 and the barrier spacers 109 may reduce the contact resistance of the contacts 101. In other words, the top conductive layers 107 and the barrier spacers 109 may be referred to as resistance reduction elements.

In some embodiments, one of dielectric layer may be omitted. For example, the second dielectric layer 503 may be omitted. The contacts 101 may protrude from the top surface 501TS of the first dielectric layer 501. The top conductive layers 107 may be formed on the top surfaces 101TS of the contacts 101 and the barrier spacers 109 may be formed on the upper parts of the sides 105S of the barrier layers 105, and on the first dielectric layer 501. For another example, the first dielectric layer 501 may be omitted.

Figure 20:
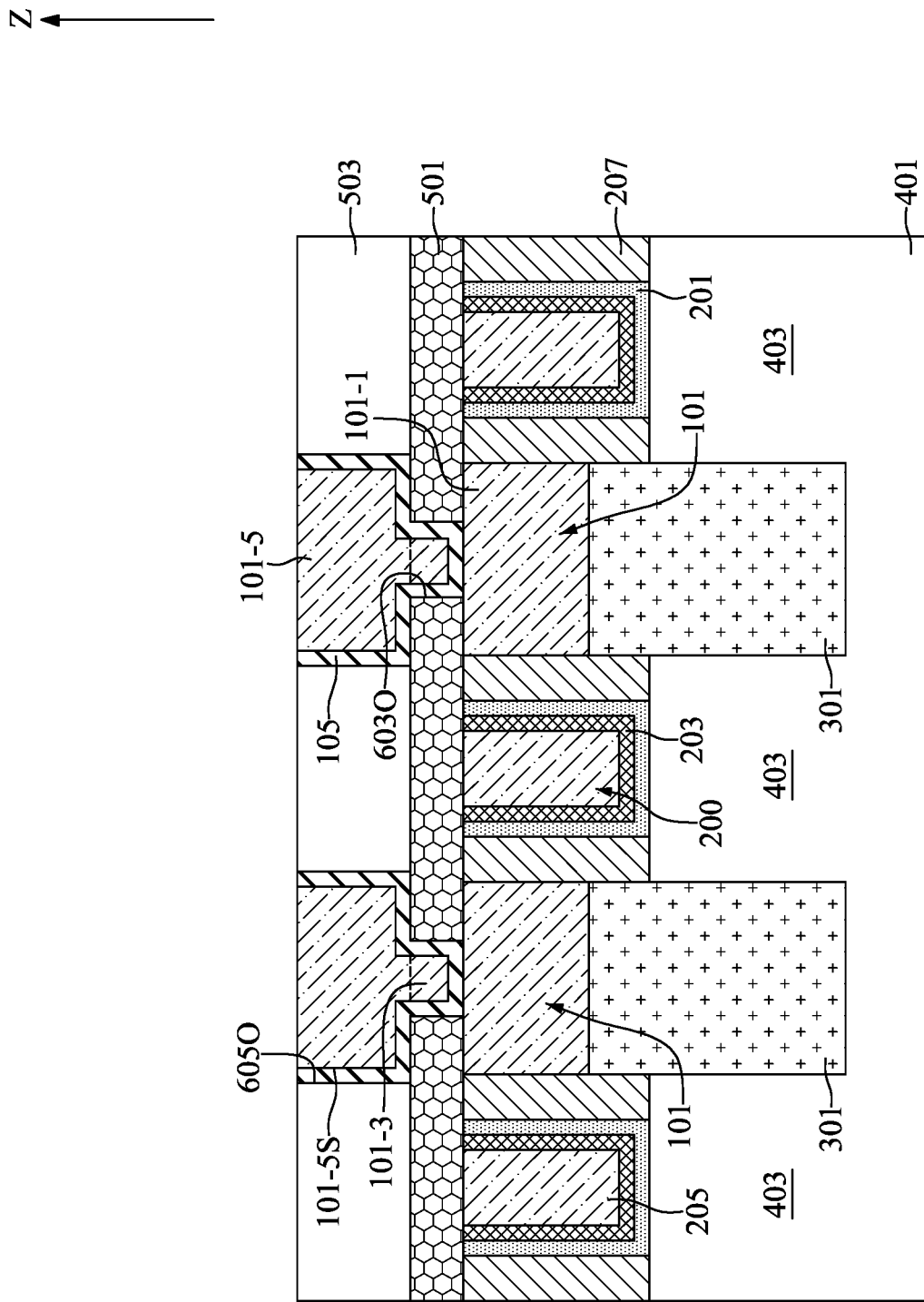
FIGS. 20 and 21 illustrate, in schematic cross-sectional view diagrams, a flow for fabricating the semiconductor device in accordance with another embodiment of the present disclosure.
Figure 21:
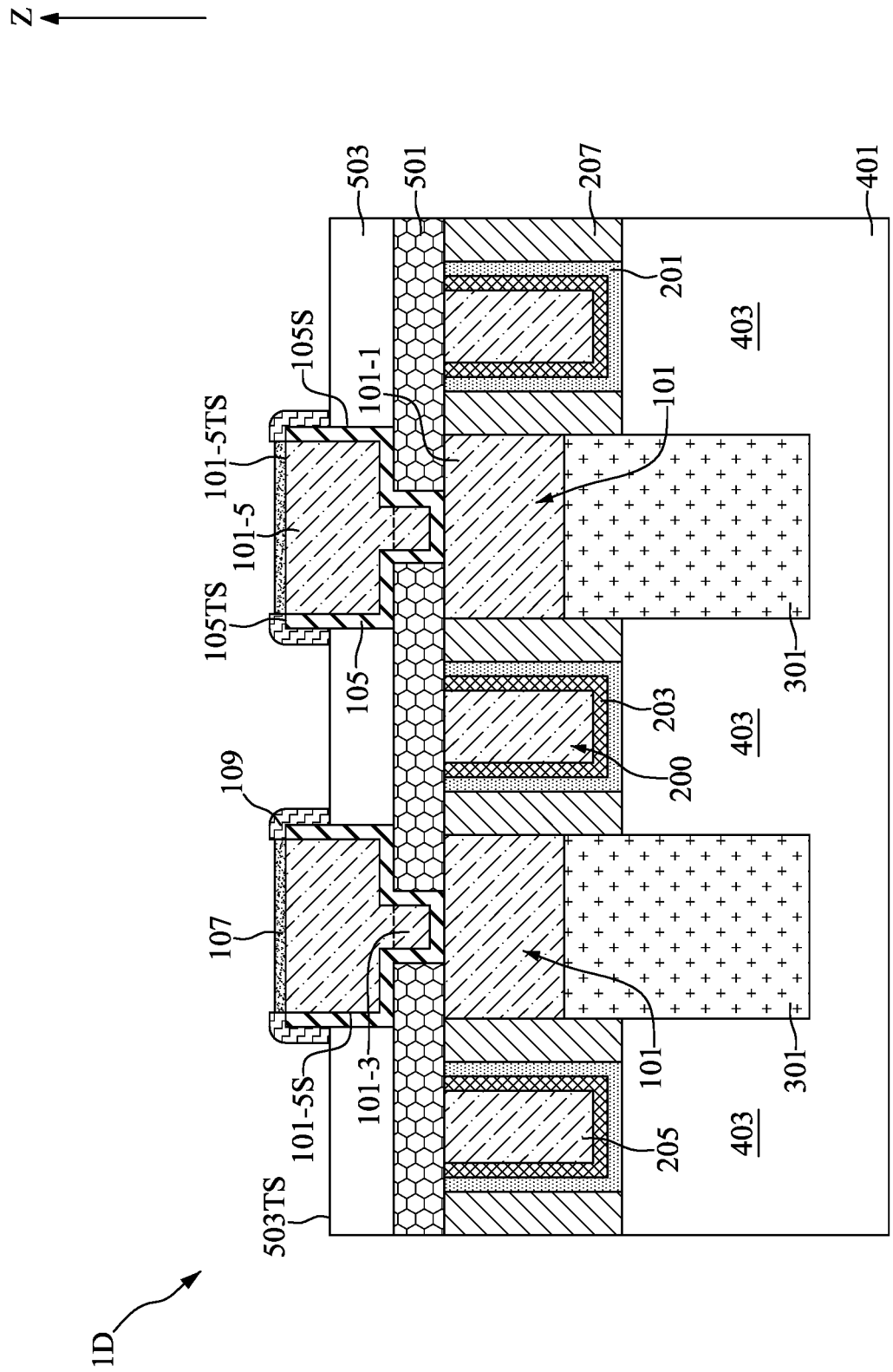

FIGS. 20 and 21 illustrate, in schematic cross-sectional view diagrams, a flow for fabricating the semiconductor device 1D in accordance with another embodiment of the present disclosure.

With reference to FIG. 20, an intermediate semiconductor device may be fabricated with a procedure similar to that illustrated in FIGS. 9 to 13. A barrier material may be conformally formed in the second openings 6030 and the third openings 6050 and on the top surface 503TS of the second dielectric layer 503. The barrier material may be, for example, titanium, titanium nitride, platinum, nickel, or a combination thereof. Subsequently, a conductive material such as tungsten, cobalt, zirconium, tantalum, titanium, aluminum, ruthenium, copper, metal carbides, metal nitrides, transition metal aluminides, or combinations thereof may be deposited into the second openings 6030 and the third openings 6050 by a deposition process. After the deposition process, a planarization process, such as chemical mechanical polishing, may be performed until the top surface 503TS of the second dielectric layer 503 to remove excess material, provide a substantially flat surface for subsequent processing steps, and concurrently form the middle portions 101-3 and the upper portions 101-5 of the contacts 101 and turn the barrier material into barrier layers 105.

With reference to FIG. 20, the barrier layers 105 may be formed between the lower portions 101-1 and the middle portions 101-3, between the first dielectric layer 501 and the middle portions 101-3, between the first dielectric layer 501 and the upper portions 101-5, and on the sides 101-5S of the upper portions 101-5.

With reference to FIG. 21, a process similar to that illustrated in FIGS. 17 to 19 may be performed to form the top conductive layers 107 and the barrier spacers 109. The top conductive layers 107 may be formed selectively on the top surfaces 101-5TS of the upper portions 101-5. The barrier spacers 109 may be formed selectively on the sides 105S of the barrier layers 105, on the top surface 105TS of the barrier layers 105, and on the top surface 503TS of the second dielectric layer 503.

Figure 22:
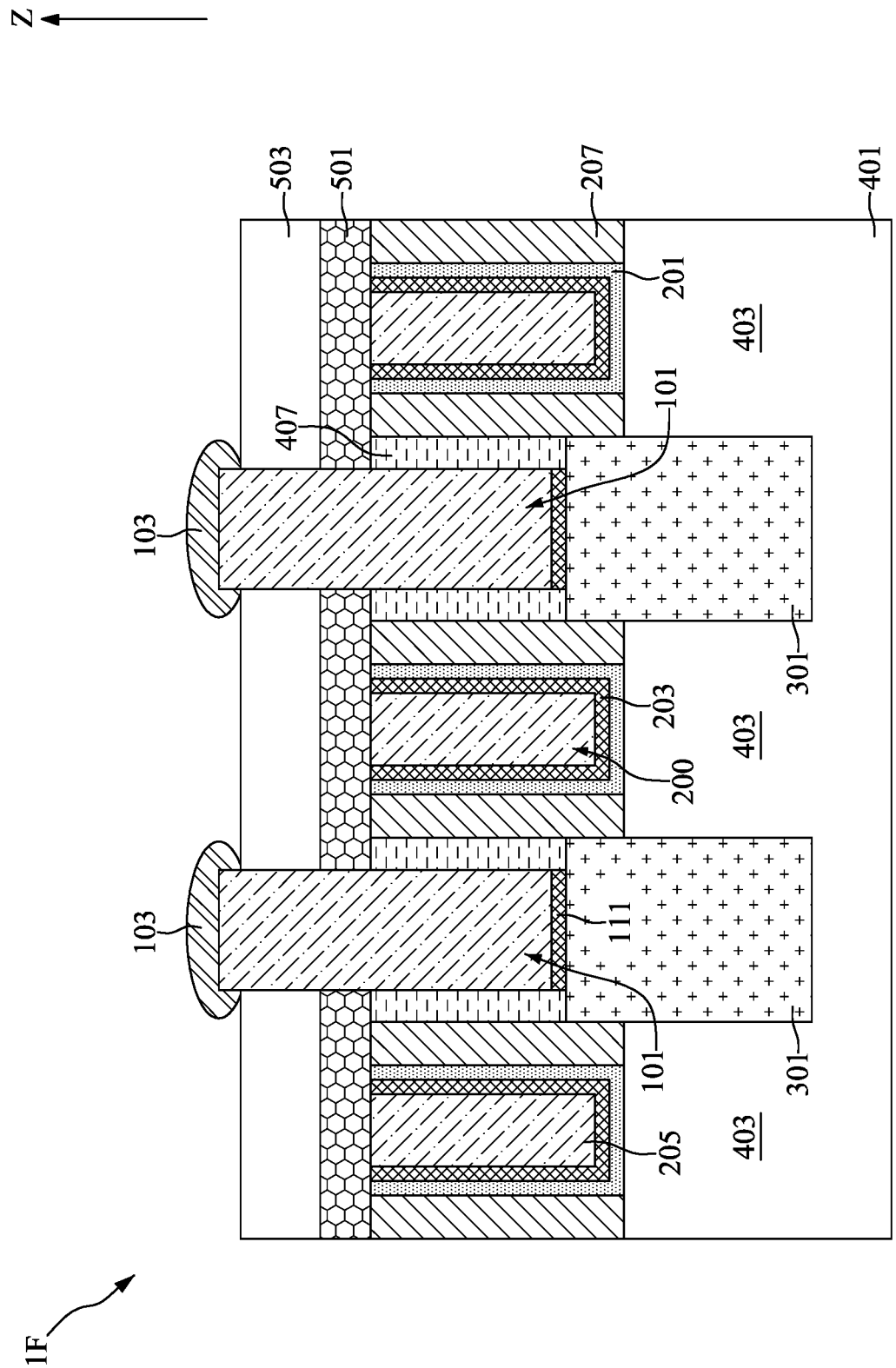
FIGS. 22 to 24 illustrate, in schematic cross-sectional view diagrams, semiconductor devices in accordance with some embodiments of the present disclosure.
Figure 23:
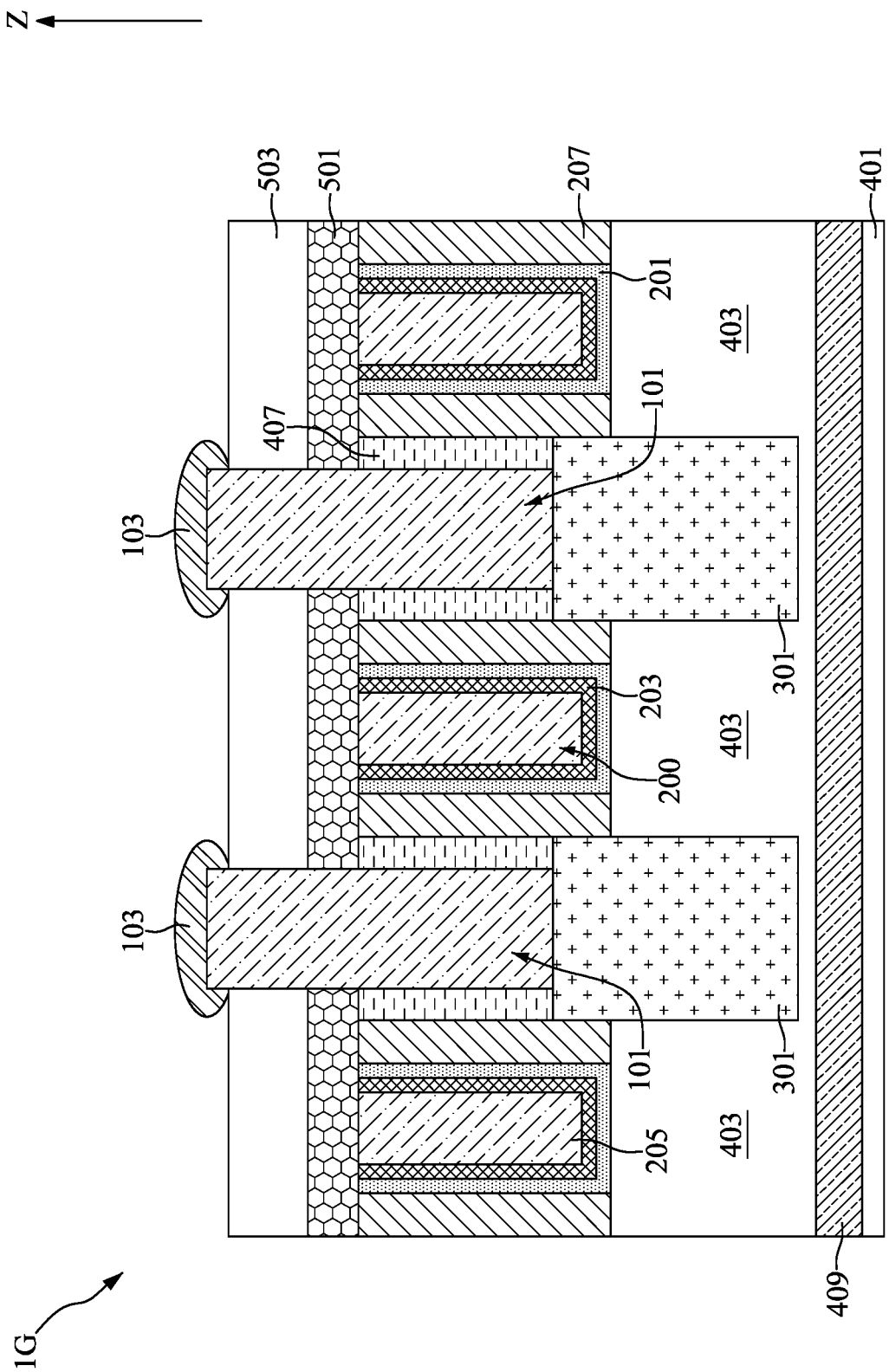
Figure 24:
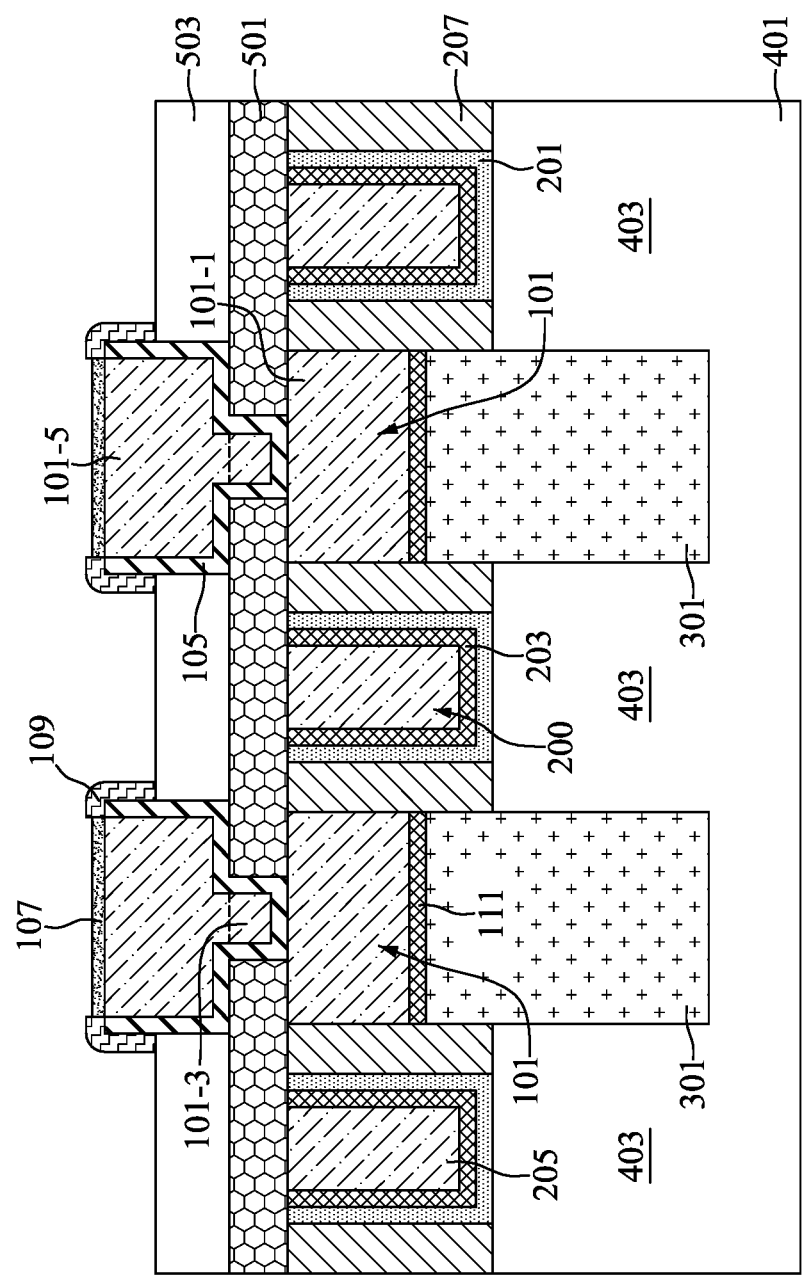

FIGS. 22 to 24 illustrate, in schematic cross-sectional view diagrams, semiconductor devices 1F, 1G, and 1H in accordance with some embodiments of the present disclosure.

With reference to FIG. 23 FIG. 22, the semiconductor device 1F may have a structure similar to that illustrated in FIG. 7. The same or similar elements in FIG. 23 FIG. 22 as in FIG. 7 have been marked with similar reference numbers and duplicative descriptions have been omitted. The semiconductor device 1F may include bottom conductive layers 111. The bottom conductive layers 111 may be disposed between the contacts 101 and the impurity regions 301. The bottom conductive layers 111 may be formed of, for example, titanium silicide, nickel silicide, nickel platinum silicide, tantalum silicide, or cobalt silicide. The thickness of the bottom conductive layers 111 may be between about 2 nm and about 20 nm. The bottom conductive layers 111 may reduce the contact resistance between the contacts 101 and the impurity regions 301.

With reference to FIG. 23, the semiconductor device 1G may have a structure similar to that illustrated in FIG. 7. The same or similar elements in FIG. 23 as in FIG. 7 have been marked with similar reference numbers and duplicative descriptions have been omitted. The semiconductor device 1G may include a buried insulation layer 409 disposed below the fins 403. In other words, the buried insulation layer 409 may be disposed between the fins 403 and the substrate 401. The buried insulation layer 409 may be formed of a crystalline or non-crystalline dielectric material such as an oxide and/or nitride. For example, the buried insulation layer 409 may be a dielectric oxide such as silicon oxide. For another example, the buried insulation layer 409 may be a dielectric nitride such as silicon nitride or boron nitride. For yet another example, the buried insulation layer 409 may include a stack of a dielectric oxide and a dielectric nitride such as a stack of, in any order, silicon oxide and silicon nitride or boron nitride. The buried insulation layer 409 may have a thickness between about 10 nm and 200 nm. The buried insulation layer 409 may eliminate leakage current between gate structures 200 and reduces parasitic capacitance associated with impurity regions 301.

With reference to FIG. 24, the semiconductor device 1H may have a structure similar to that illustrated in FIG. 21. The same or similar elements in FIG. 24 as in FIG. 21 have been marked with similar reference numbers and duplicative descriptions have been omitted. The semiconductor device 1H may include bottom conductive layers 111. The bottom conductive layers 111 may be disposed between the lower portions 101-1 of the contacts 101 and the impurity regions 301. The bottom conductive layers 111 may be formed of, for example, titanium silicide, nickel silicide, nickel platinum silicide, tantalum silicide, or cobalt silicide. The thickness of the bottom conductive layers 111 may be between about 2 nm and about 20 nm. The bottom conductive layers 111 may reduce the contact resistance between the lower portions 101-1 of the contacts 101 and the impurity regions 301.

One aspect of the present disclosure provides a semiconductor device including a fin, a gate structure positioned on the fin, impurity regions positioned on two sides of the fin, contacts positioned on the impurity regions, and conductive covering layers positioned on the contacts. The conductive covering layers are formed of copper germanide.

Another aspect of the present disclosure provides a semiconductor device including a fin, a gate structure positioned on the fin, impurity regions positioned on two sides of the fin, contacts positioned on the impurity regions, and top conductive layers positioned on the contacts. The top conductive layers are formed of titanium silicide, nickel silicide, nickel platinum silicide, tantalum silicide, or cobalt silicide.

Another aspect of the present disclosure provides a semiconductor device including a fin, a gate structure positioned on the fin, a first dielectric layer positioned on the gate structure, impurity regions positioned on two sides of the fin, contacts including lower portions positioned on the impurity regions and below the first dielectric layer, middle portions positioned on the lower portions and along the first dielectric layer, and upper portions positioned on the middle portions, and insulation layers positioned on the first dielectric layer and between the upper portions.

Another aspect of the present disclosure provides a method for fabricating a semiconductor device including forming a gate structure over a fin, forming impurity regions on two sides of the fin, forming contacts on the impurity regions, and forming conductive covering layers on the contacts. The conductive covering layers are formed of copper germanide Due to the design of the semiconductor device of the present disclosure, the conductive covering layers 103 formed of copper germanide may reduce the contact resistance of the semiconductor device 1A. According, the performance of the semiconductor device 1A may be improved and the energy consumption of the semiconductor device 1A may be reduced.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a fin;
   a gate structure positioned on the fin;
   impurity regions positioned on two sides of the fin;
   contacts positioned on the impurity regions; and
   top conductive layers positioned on and directly contacted with top surfaces of the contacts;
   a first dielectric layer positioned on the gate structure and a second dielectric layer positioned on the first dielectric layer, wherein the contact includes upper portions positioned along the second dielectric layer and protruding from a top surface of the second dielectric layer;
   barrier layers positioned on and directly contacted with sides of the upper portions of the contact;
   barrier spacers positioned on and directly contacted with sides of the upper portions of the barrier layers and the top surface of the second dielectric layer;
   wherein the top conductive layers are formed of titanium silicide, nickel silicide, nickel platinum silicide, tantalum silicide, or cobalt silicide.

2. The semiconductor device of claim 1, wherein the contacts comprise:
   lower portions positioned on the impurity regions and below the first dielectric layer;
   middle portions positioned along the first dielectric layer and on the lower portions; and
   the upper portions positioned on the middle portions;
   wherein the top conductive layers are positioned on the upper portions.

3. The semiconductor device of claim 2, wherein the barrier layers are positioned between the lower portions and the middle portions, and between the middle portions and the first dielectric layer.

4. The semiconductor device of claim 1, wherein the barrier layers are positioned between the contacts and the gate structure and between the contacts and the impurity regions.

5. The semiconductor device of claim 4, wherein the first dielectric layer is positioned on the gate structure, the contacts and the barrier layers are positioned along the first dielectric layer and protruding from a top surface of the first dielectric layer.

* * * * *